United States Patent
Noro et al.

(10) Patent No.: US 6,617,046 B2
(45) Date of Patent: Sep. 9, 2003

(54) THERMOSETTING RESIN COMPOSITION AND SEMICONDUCTOR DEVICE USING THE SAME

(75) Inventors: Hiroshi Noro, Ibaraki (JP); Mitsuaki Fusumada, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/073,422

(22) Filed: Feb. 13, 2002

(65) Prior Publication Data

US 2002/0151106 A1 Oct. 17, 2002

(30) Foreign Application Priority Data

Feb. 14, 2001 (JP) ........................................ 2001-037725
Feb. 14, 2001 (JP) ........................................ 2001-037726
Feb. 14, 2001 (JP) ........................................ 2001-037728
Sep. 28, 2001 (JP) ........................................ 2001-301054

(51) Int. Cl.⁷ .............................................. H01L 29/12
(52) U.S. Cl. ................... 428/620; 257/787; 257/788; 257/793; 428/418; 523/455; 525/530; 525/533; 560/76; 560/84; 560/129; 560/190; 560/193
(58) Field of Search .............................. 257/787, 788, 257/789, 793, 795, 796; 428/418, 620; 523/455; 525/530, 533; 560/76, 84, 129, 190, 193, 202

(56) References Cited

U.S. PATENT DOCUMENTS 4,845,265 A * 7/1989 Lapin et al. .................. 560/84
6,180,696 B1 1/2001 Wong et al.

FOREIGN PATENT DOCUMENTS

EP   0 951 064 A1   10/1999
JP      05139049     6/1993

\* cited by examiner

Primary Examiner—Robert Dawson
Assistant Examiner—D. Aylward
(74) Attorney, Agent, or Firm—Birch, Stewart, Kolasch & Birch, LLP

(57) ABSTRACT

A thermosetting resin composition usable for sealing a gap formed between a printed circuit board and a semiconductor element in a semiconductor package having a face-down structure; a semiconductor device comprising a printed circuit board, a semiconductor element, and the thermosetting resin composition mentioned above, wherein a gap formed between the printed circuit board and the semiconductor element is sealed by the thermosetting resin composition; and a process for manufacturing the semiconductor device.

9 Claims, 2 Drawing Sheets

THERMOSETTING RESIN COMPOSITION AND SEMICONDUCTOR DEVICE USING THE SAME

BACKGROUND OF THE INVENTION

1. Field of the Invention

The present invention relates to a thermosetting resin composition used for sealing an air gap formed between a printed circuit board and a semiconductor element in a semiconductor device. Further, the present invention relates to a semiconductor device manufactured by mounting a semiconductor element in a face-down structure on a printed circuit board using the resin composition.

2. Discussion of the Related Art

With the recent demand for performance improvement in the semiconductor devices, there has been proposed a method for mounting a semiconductor element in a face-down structure to a printed circuit board (flip-chip method, direct chip attachment method and the like). In the flip-chip method, since a semiconductor element and a printed circuit board, each having a different coefficient of thermal expansion, are directly electrically connected, there arise a problem in the reliability of the connecting parts. In view of this problem, there has been employed a method comprising filling a gap formed between the semiconductor element and the printed circuit board with a liquid resin material, and curing the liquid resin material to form a resin cured product, so that the stress concentrating in an electrically connected part is also distributed in the above-mentioned resin cured product, thereby improving connection reliability. The conventional method for filling a gap formed between the semiconductor element and the printed circuit board with a liquid material in the flip-chip method using a solder bump comprises firstly mounting the flip chip to a printed circuit board, forming metal bonding by a solder melting step, and thereafter injecting the liquid resin material in a gap formed between the semiconductor element and the printed circuit board. Since the method of filling the gap formed between the semiconductor element and the printed circuit board with the above-mentioned liquid resin material is carried out by the capillary tube effect of the liquid resin material, the viscosity of the liquid resin material must be adjusted to a low level. Therefore, there is a limited range of materials to select from in order to have a low viscosity, so that the uses of rubber components giving low-stress effects and a phenolic resin having high reliability have been difficult under these circumstances. Further, the above-mentioned liquid resin material must be stored at an ultralow temperature of about −40° C. in order to stably keep the viscosity of the above-mentioned liquid resin material low, and the liquid resin material must be injected with a needle into a gap formed between the above-mentioned semiconductor element and board, so that there arise problems such as difficulty in the injection positioning or difficulty in controlling the amount of the injection.

In addition, since the method for manufacturing the above-mentioned semiconductor device comprises a large number of steps, low productivity becomes a problem. Further, in order to improve productivity as compared to that of the above-mentioned method, there has been proposed a pressing method comprising mounting a flip chip on a printed circuit board previously coated with a liquid material with applications of appropriate temperature and pressure. However, in the pressing method, an oxide layer must be removed during bump bonding in metal electrodes such as solder bumps requiring the formation of metal bond. Therefore, this method can only be applied to a process for manufacturing a semiconductor device which is subjected to electric connection by metal contact using, for instance, a gold stud bump, and it has been difficult to apply it to mounting of a semiconductor device having metal electrodes requiring the formation of metallic bonds such as solder bumps.

Further, in the recent year, a process for manufacturing a semiconductor device has been developed using a thermosetting resin material having a flux activity in an attempt for a more simplified process than the method of injecting a liquid material utilizing a capillary phenomenon, said process comprising previously applying the thermosetting resin material to a semiconductor element or a printed circuit board, carrying out resin sealing at the interface together with chip mounting, and forming metal bonding by solder reflow. Therefore, the production steps comprising application of flux and cleaning, and injection of a liquid resin and the like can be reduced, as compared to the conventional process for manufacturing a semiconductor device using a liquid resin material, so that the productivity of the semiconductor device can be improved. Since the method of filling the gap formed between the semiconductor element and the printed circuit board with the above-mentioned liquid resin material is carried out by a capillary tube effect of the liquid resin material, the viscosity of the liquid resin material must be adjusted to a low level. Therefore, since an acid anhydride-based curing agent is used for obtaining a low viscosity, the materials are selected from a limited range, so that it has been difficult to use a phenolic resin having high moisture tolerance reliability under these circumstances.

An object of the present invention is to provide a thermosetting resin composition having a flux activity, which has excellent relaxation effect of a stress caused between a semiconductor element or a printed circuit board and connecting electrodes, is capable of easily forming a sealing resin layer in an air gap formed between the semiconductor element and the printed circuit board, and does not need a cleaning step for the flux; and a semiconductor device manufactured by using the thermosetting resin composition. Also, another object of the present invention is to provide a thermosetting resin composition having excellent productivity, which enables mounting of flip chips to which a thermosetting composition having a function of removing a metal oxide layer or oxidation-preventing material (hereinafter referred to as pre-flux) existing on the surface of the electrodes on the semiconductor element or the printed circuit board in the process for manufacturing a semiconductor device requiring the formation of metal bonding such as solder bumps is previously applied; a semiconductor device manufactured by using the thermosetting resin composition; and a process for manufacturing the semiconductor device.

These and other objects of the present invention will be apparent from the following description.

SUMMARY OF THE INVENTION

According to the present invention, there are provided:

[1] a sheet-like thermosetting resin composition usable for sealing a gap formed between a printed circuit board and a semiconductor element in a semiconductor package having a face-down structure, comprising a compound having the general formula (1):

wherein n is a positive integer; R¹ is a monovalent or higher polyvalent organic group; and R² is a monovalent organic group, wherein R¹ and R² may be identical or different, or a compound having the general formula (2):

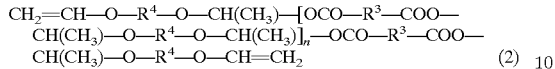

wherein n is a positive integer; each of R³ and R⁴ is a divalent organic group, wherein R³ and R⁴ may be identical or different;

[2] a thermosetting resin composition usable for sealing a gap formed between a printed circuit board and a semiconductor element in a semiconductor package having a face-down structure, comprising:

an epoxy resin, a phenolic resin-based curing agent and a compound having the general formula (1):

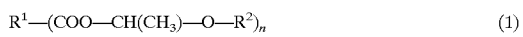

wherein n is a positive integer; R¹ is a monovalent or higher polyvalent organic group; and R² is a monovalent organic group, wherein R¹ and R² may be identical or different, or a compound having the general formula (2):

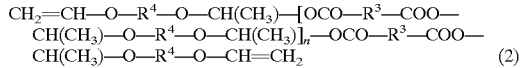

wherein n is a positive integer; each of R³ and R⁴ is a divalent organic group, wherein R³ and R⁴ may be identical or different;

[3] a process for manufacturing a semiconductor device comprising the steps of:

applying the thermosetting resin composition of item [2] above to a wafer, dicing the coated wafer into individual chips, and carrying out chip-mounting;

[4] a thermosetting resin composition comprising:

an epoxy resin, an acid anhydride-based curing agent and a compound having the general formula (1):

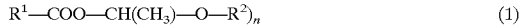

wherein n is a positive integer; R¹ is a monovalent or higher polyvalent organic group; and R² is a monovalent organic group, wherein R¹ and R² may be identical or different, or a compound having the general formula (2):

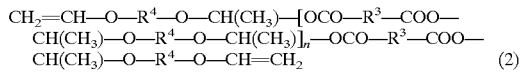

wherein n is a positive integer; each of R³ and R⁴ is a divalent organic group, wherein R³ and R⁴ may be identical or different, and wherein the thermosetting resin composition is liquid at 25° C.;

[5] a thermosetting resin composition comprising:

(A) an epoxy resin having at least two epoxy groups in its molecule, (B) a curing agent, (C) a compound having the general formula (1):

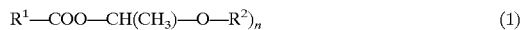

wherein n is a positive integer; R¹ is a monovalent or higher polyvalent organic group; and R² is a monovalent organic group, wherein R¹ and R² may be identical or different, or a compound having the general formula (2):

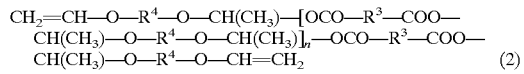

wherein n is a positive integer; each of R³ and R⁴ is a divalent organic group, wherein R³ and R⁴ may be identical or different; and (D) a microcapsulated curing accelerator comprising a core portion comprising a curing accelerator, and a shell portion formed so as to cover the core portion, the shell portion comprising a polymer having a structural unit represented by a general formula (3):

wherein each of R⁵ and R⁶ is hydrogen atom or a monovalent organic group, wherein R⁵ and R⁶ may be identical or different, wherein the thermosetting resin composition has a reaction exothermic peak of 180° to 250° C. with a programming rate of 10° C./min in the differential scanning calorimetric determination; and

[6] a semiconductor device comprising:

a printed circuit board, a semiconductor element, and the thermosetting resin composition of any one of items [1], [2], [4] and [5] above, wherein a gap formed between the printed circuit board and the semiconductor element is sealed by the thermosetting resin composition.

DETAILED DESCRIPTION OF THE INVENTION

Figure 1:
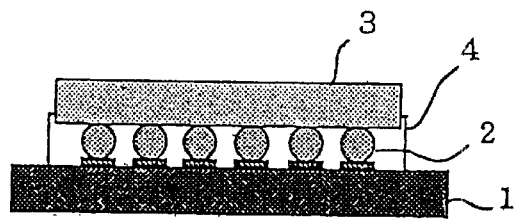
FIG. 1 is a schematic cross-sectional view showing one example of a semiconductor device.

The thermosetting resin composition of the present invention is suitably used for sealing a semiconductor element having a face-down structure. Specifically, in a semiconductor device comprising a printed circuit board, plural connecting electrodes and a semiconductor element having a face-down structure mounted on the printed circuit board via the plural connecting electrodes, the thermosetting resin composition is used for sealing an air gap formed between the printed circuit board and the semiconductor element. The air gap formed between the semiconductor element and the printed circuit board is sealed and metal bonding is formed by inserting the thermosetting resin composition between the printed circuit board and the semiconductor element, applying heat and pressure, thereby tentatively fixing the semiconductor element on the printed circuit board, and thereafter soldering and melting the thermosetting resin composition.

By the sealing of the air gap formed between the semiconductor element and the printed circuit board and the formation of metal bonding by using the resin composition of the present invention, a process for resin sealing of the printed circuit board with the semiconductor element and metal connection can be simplified, as compared to a conventional complicated process of metal connection of the semiconductor bump with electrodes on a printed circuit board using flux, and thereafter flowing of a sealing resin into the air gap, whereby remarkable shortening of the manufacturing process time can be achieved. Further, an electric connection of the semiconductor element with the printed circuit board has excellent stability, so that an excellent sealing reliability is exhibited in various reliability tests such as those reliability tests under cooling-heating cycle.

One of the great features of the thermosetting resin composition of the present invention resides in that the thermosetting resin composition comprises as a flux active agent any one of the following compound having the general formula (1):

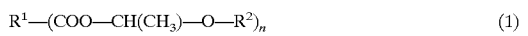
$$R^1—(COO—CH(CH_3)—O—R^2)_n \quad (1)$$

wherein n is a positive integer; $R^1$ is a monovalent or higher polyvalent organic group; and $R^2$ is a monovalent organic group, wherein $R^1$ and $R^2$ may be identical or different; or the compound having the general formula (2):

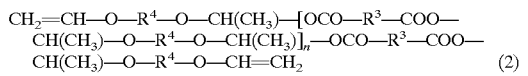
$$CH_2=CH—O—R^4—O—CH(CH_3)—[OCO—R^3—COO—$$
$$CH(CH_3)—O—R^4—O—CH(CH_3)]_n—OCO—R^3—COO—$$
$$CH(CH_3)—O—R^4—O—CH=CH_2 \quad (2)$$

wherein n is a positive integer; each of $R^3$ and $R^4$ is a divalent organic group, wherein $R^3$ and $R^4$ may be identical or different.

Here, the term "flux activity" refers to an ability of removing an oxide layer, an organic substance or the like on the metal surface to be bonded upon soldering to prevent progress of oxidation during heating, thereby lowering surface tension of the dissolved solder. The term "flux active agent" refers to a compound or composition which gives a composition for sealing a semiconductor device a flux activity.

The flux active agent contained in the thermosetting resin composition can be obtained by a reaction of a carboxylic acid and a vinyl ether compound. The carboxylic acid includes, for instance, acetic acid, adipic acid, maleic acid, fumaric acid, itaconic acid, phthalic acid, trimellitic acid, pyromellitic acid, acrylic acid, isocyanuric acid, carboxyl group-containing polybutadiene, and the like. The above-mentioned vinyl ether compound includes, for instance, a vinyl ether containing butyl group, ethyl group, propyl group, isopropyl group, cyclohexyl group, or the like.

Concrete examples of $R^1$ in the above-mentioned general formula (1) include an alkyl group or alkylene group having 1 to 6 carbon atoms, vinyl group, allyl group, phenyl group, phenylene group, a trivalent or higher polyvalent aromatic group, and a group represented by $C_3N_3(OCOC_2H_4)_3$. Concrete examples of $R^2$ of the above-mentioned general formula (1) include an alkyl group having 1 to 10 carbon atoms and a cycloalkyl group having 3 to 6 carbon atoms.

Concrete examples of $R^3$ in the above-mentioned general formula (2) include those functional groups having structures represented by the formulas (4) to (7):

(4)

(5)

(6)

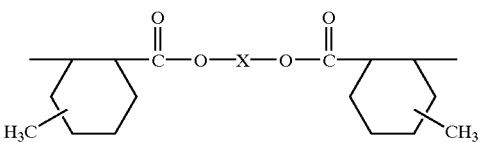
(7)

wherein n is a positive integer and X is a divalent organic group.

Concrete examples of $R^4$ in the above-mentioned general formula (2) include those functional groups having structures represented by the formulas (8) to (10):

(8)

(9)

(10)

wherein n is a positive integer.

The compound described above can react with an epoxy resin after exhibiting its flux activity in the process for mounting semiconductor device, so that the compound can be suitably used as a material having both the functions of the flux active agent and the curing agent. In addition, these compounds can be used alone or in admixture of two or more kinds.

The thermosetting resin composition of the present invention can be roughly classified into four embodiments. In all of the embodiments, the formulation proportion of the above-mentioned flux active agent is preferably within the range of 0.1 to 20 parts by weight, more preferably within the range of 0.5 to 15 parts by weight, especially preferably within the range of 1 to 10 parts by weight, based on 100 parts by weight of the total resin amount, from the viewpoints of the solder connectivity, the heat resistance and the moisture tolerance reliability.

[First Embodiment]

A first embodiment of the present invention relates to a sheet-like thermosetting resin composition comprising a compound having the general formula (1) or (2) mentioned above.

The resins constituting the main materials for the above-mentioned sheet-like thermosetting resin composition include, for instance, epoxy resins, silicone resins, urethane resins, phenoxy resins, and the like. Among them, the epoxy resins are preferable, from the viewpoints of the heat resistance, the workability and the adhesiveness.

As the epoxy resin, any of those compounds having two or more epoxy groups in its molecule can be used without particular limitation. Examples thereof include, for instance, bisphenol A epoxy resins, bisphenol F epoxy resins, biphenyl epoxy resins, o-cresol novolak epoxy resins, triphenolmethane epoxy resins, dicyclopentadiene epoxy resins, and terpene epoxy resins. Among them, those epoxy resins having a melt viscosity of 0.5 Pa·s or less at 150° C. can be more preferably used, from the viewpoints of the improvement in the flux activity, the adhesiveness, and the reduction in voids.

In addition, those epoxy resins having excellent wettability during dissolution and a low viscosity can be preferably used. The epoxy resins having the structures represented by the formulas (11) to (13) are especially preferable, from these viewpoints. These epoxy resins can be used alone or in admixture of two or more kinds.

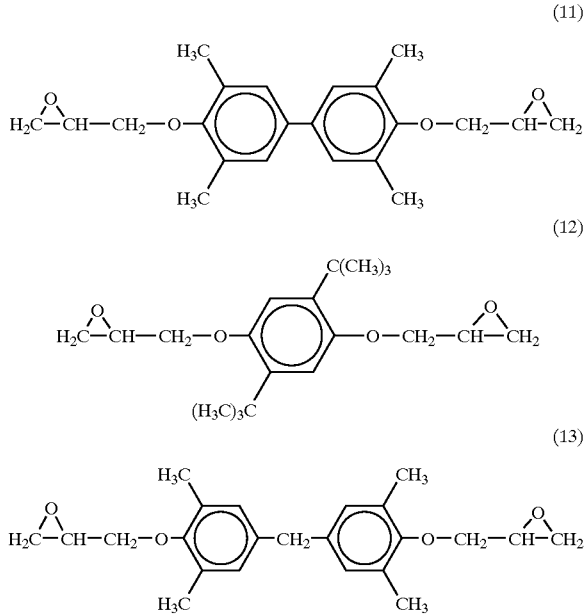

In addition, in the above-mentioned sheet-like thermosetting resin composition, a curing agent for the epoxy resin can be formulated as occasion demands. The curing agent as described above includes, for instance, phenolic resins, acid anhydrides, amine compounds, and the like. The phenolic resin is especially preferable, from the viewpoints of the reliability and the like, among which those phenolic resins having a melt viscosity of 0.5 Pa·s or less at 150° C. are more preferably used. In addition, those curing agents having a hydroxyl equivalence of from 60 to 200 are preferable, and more preferably from 80 to 180.

When the phenolic resin is used as the curing agent, the content of the phenolic resin is preferably from 0.6 to 1.4 equivalence, especially preferably from 0.7 to 1.1 equivalence, per one equivalence of the epoxy resin in the sheet-like thermosetting resin composition, from the viewpoints of the thermosetting property, the heat resistance and the moisture tolerance reliability.

The content of the total resin in the above-mentioned sheet-like thermosetting resin composition is preferably 40% by weight or more, more preferably 60% by weight or more, especially preferably 80% by weight or more, of the sheet-like thermosetting resin composition, from the viewpoints of the solderability, the fluidity, and the adhesiveness.

The above-mentioned sheet-like thermosetting resin composition may contain acrylonitrile-butadiene copolymers (NBR) as a rubber component, and other copolymerizable components can be contained together with NBR. The other copolymerizable component includes, for instance, hydrogenated acrylonitrile-butadiene rubbers, acrylic acid, acrylic ester, styrene, methacrylic acid, and the like. Among them, acrylic acid and methacrylic acid are preferable, from the viewpoints of having excellent adhesiveness with a metal or plastic. In addition, the content of acrylonitrile in the above-mentioned NBR is preferably from 10 to 50% by weight, more preferably from 15 to 40% by weight, from the viewpoints of giving excellent compatibility with the epoxy resin and flexibility. The formulation ratio of the above-mentioned acrylonitrile-butadiene copolymer in the entire organic components in the sheet-like thermosetting resin composition of the present invention is not particularly limited as long as the thermosetting resin composition can be formed into a sheet.

In the above-mentioned sheet-like thermosetting resin composition, besides the curing agent for the epoxy resin mentioned above, a curing accelerator for the epoxy resin can also be formulated. As the curing accelerator mentioned above, various curing accelerators which have been conventionally known as curing accelerators for epoxy resins can be used. The curing accelerator includes, for instance, amine-based curing accelerators, phosphorus-containing curing accelerators, boron-containing curing accelerators, phosphorus-boron-containing curing accelerators such as triphenylphosphine, 2-methylimidazole, DBU (1,8-diazabicyclo[5.4.0]undecene-7), and DBN (1,5-diazabicyclo[4.3.0]nonene-5), 4P4B (tetraphenylphosphonium tetraphenylborate). In addition, a latent curing catalyst, which comprises a curing accelerator sealed in a microcapsule, is more preferably used, from the viewpoints of the storage ability and the lowering of melt viscosity. These curing accelerators can be used alone or in admixture of two or more kinds.

To the above-mentioned sheet-like thermosetting resin composition, other materials such as organic materials and inorganic materials can be added as occasion demands. The organic material includes silane coupling agents, titanium coupling agents, surface modifying agents, antioxidants, tackifying agents, and the like. The inorganic material includes various fillers such as alumina, silica and silicon nitride, metallic particles made of copper, silver, aluminum, nickel and solder; other pigments and dyes; and the like. The mixing ratio of the inorganic material is not particularly limited. It is preferable that the mixing ratio of the inorganic material is preferably 85% by weight or more, more preferably 80% by weight or more, of the composition, from the viewpoint of the electric bonding between the electrodes of the semiconductor element and the electrodes of the printed circuit board.

The size (area) of the above-mentioned sheet-like thermosetting resin composition is appropriately set depending upon the size of the semiconductor elements to be mounted, and it is preferable that the sheet-like thermosetting resin composition has a size which is substantially the same as the size of the semiconductor element. Similarly, the thickness and the weight of the sheet-like thermosetting resin composition are appropriately set in accordance with the size of the semiconductor element to be mounted and the size of the spherical connecting electrodes provided on the semiconductor element, namely the volume occupied by a sealing resin layer formed by filling and sealing an air gap formed between the semiconductor element and the printed circuit board.

The above-mentioned sheet-like thermosetting resin composition can be prepared, for instance, as follows. Each of the components of an epoxy resin, an acrylonitrile-butadiene copolymer, and a compound represented by the general formula (1) or (2) mentioned above is formulated in a given amount, and various components such as a curing agent, a curing accelerator and various fillers are formulated as occasion demands to give a composition. The resulting composition is mixed and melted in a solvent such as toluene, methyl ethyl ketone or ethyl acetate, and the mixed solution is applied to a substrate film such as a polyester film which is subjected to mold releasing treatment. Next, the coated substrate film is dried at 50° to 160° C., and a solvent such as toluene was removed, thereby giving a desired sheet-like thermosetting resin composition on the above-mentioned substrate film. In addition, as an alternative method, a sheet-like thermosetting resin composition can be prepared by melting and extruding the components without using a solvent such as toluene.

A cured product produced by curing the above-mentioned sheet-like thermosetting resin composition can be, for instance, produced as follows. Specifically, the desired cured product can be produced by thermally curing the sheet-like thermosetting resin composition obtained by the above method preferably at 100° to 225° C., more preferably at 120° to 200° C., for preferably 3 to 300 minutes, more preferably 5 to 180 minutes.

As shown in FIG. 1, a semiconductor device manufactured by using the above-mentioned sheet-like thermosetting resin composition comprises a printed circuit board 1, plural connecting electrodes 2 and a semiconductor element 3 mounted on one side of the printed circuit board 1 via the plural connecting electrodes 2, and a sealing resin layer 4 is formed between the printed circuit board 1 and the semiconductor element 3 mentioned above.

The above-mentioned plural connecting electrodes 2 which electrically connect the printed circuit board 1 with the semiconductor element 3 mentioned above may be previously arranged on the side of the printed circuit board 1, or previously arranged on the side of the semiconductor element 3. Further, the plural connecting electrodes 2 may be previously arranged on both the side of the printed circuit board 1 and the side of the semiconductor element 3.

The materials for the printed circuit board 1 is not particularly limited, and can be roughly classified into ceramic substrates and plastic substrates. The above-mentioned plastic substrate includes, for instance, epoxy substrates, bismaleimidetriazine substrates, polyimide substrates and the like. The sheet-like thermosetting resin composition having flux activity of the present invention can be suitably used without particular limitation, even when a bonding temperature cannot be set high due to its problem in heat resistance as in a case where a plastic substrate is used in combination with connecting electrodes made of low-melting point solder and the like.

The connecting electrodes 2 may be only composed of electrodes, or they may have a structure in which an electrode is provided with an electrically conductive member such as joint ball. The materials for the connecting electrodes 2 are not particularly limited. The materials therefor include, for instance, low-melting point and high-melting point bumps made of solder, tin bumps, silver-tin bumps, and the like. Also, in a case where the electrodes on the printed circuit board are made of the materials mentioned above, the connecting electrodes may be gold bumps, copper bumps and the like.

The semiconductor element 3 is not particularly limited, and those conventionally used can be employed. For instance, various semiconductors such as elementary semiconductors of silicon and germanium, and compound semiconductors of gallium arsenide, indium phosphide or the like can be used. The size of the semiconductor element 3 is usually set to have a width of 2 to 20 mm, a length of 2 to 20 mm and a thickness of 0.1 to 0.6 mm. In addition, the size of the printed circuit board 1 in which a semiconductor element 3-mounted printed circuit is formed is set to have a width of 10 to 70 mm, a length of 10 to 70 mm and a thickness of 0.05 to 3.0 mm, to match the size of the semiconductor element 3. In addition, in the case of a map type board (one mounting many semiconductor elements on the same printed circuit board), the width and the length can be both set at 40 mm or more. Also, it is preferable that the distance between the semiconductor element 3 and the printed circuit board 1 into which the dissolved sealing resin is filled is usually from 5 to 100 μm.

As described above, the semiconductor device using the above-mentioned sheet-like thermosetting resin composition is manufactured by inserting a layered solid resin between a printed circuit board and a semiconductor element, melting this solid resin, and forming a sealing resin layer. One embodiment for the method for manufacturing a semiconductor device of the present invention will be sequentially explained in accordance with the drawings.

Figure 2:
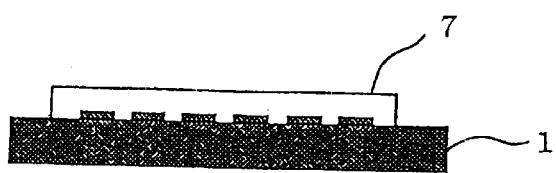
FIG. 2 is a schematic cross-sectional view showing a process for manufacturing a semiconductor device.
Figure 3:
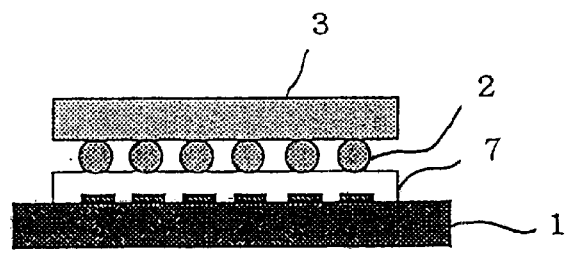
FIG. 3 is a schematic cross-sectional view showing a process for manufacturing a semiconductor device.

First, as shown in FIG. 2, a sheet-like thermosetting resin composition 7 of the present invention is placed on a printed circuit board 1. Next, as shown in FIG. 3, a semiconductor element 3 provided with plural spherical connecting electrodes (joint balls) 2 is mounted on given positions on the sheet-like thermosetting resin composition 7, and the sheet-like thermosetting resin composition 7 is melted to give a molten state. The semiconductor element 3 is pressed so that the connecting electrodes 2 on the semiconductor element 3 push out the sheet-like thermosetting resin composition 7 in a molten state, so that the printed circuit board 1 is contacted with the connecting electrodes 2, and that an air gap formed between the semiconductor element 3 and the printed circuit board 1 is filled with a molten resin. The metal bonding is carried out by solder reflow, and then the resin is cured to seal the air gap, thereby forming a sealing resin layer 4. In this method, the solder reflow method may be a bonding method using a reflow furnace, or a bonding method simultaneously with mounting a chip, with heating and soldering and melting a heater portion to a temperature of equal to or higher than the melting point of the solder. As described above, the semiconductor device as shown in FIG. 1 is manufactured.

In the process for manufacturing the semiconductor device mentioned above, a case where a semiconductor element 3 provided with plural connecting electrodes (joint balls) 2 is described. The present invention is not limited thereto, and a case where plural spherical connecting electrodes 2 are previously provided on a printed circuit board 1 may also be employed.

In the process for manufacturing a semiconductor device mentioned above, the heating temperature when the sheet-like thermosetting resin composition 7 is melted to give a molten state is appropriately set in consideration of the heat resistance of the semiconductor element 3 and the printed circuit board 1, and the melting point of the connecting electrodes 2, and the softening point and heat resistance of the sheet-like thermosetting resin composition 7.

When the molten sheet-like thermosetting resin composition is filled in an air gap formed between the semiconductor element 3 and the printed circuit board 1, it is preferable that the semiconductor element is pressed as described above. The pressing conditions are appropriately set depending upon the material and the number of connecting electrodes (joint balls). Concretely, the pressure is set within the range of from 0.1 to 50 gf/number, preferably within the range of from 0.2 to 20 gf/number.

[Second Embodiment]

A second embodiment of the present invention relates to a thermosetting resin composition comprising an epoxy resin, a phenolic resin-based curing agent and a compound having the general formula (1) or (2) mentioned above.

The resins constituting the main materials for the above-mentioned thermosetting resin composition are epoxy resins. As the epoxy resin, any of those having two or more epoxy groups in its molecule can be used without particular limitation. The epoxy resin thereof includes, for instance, bisphenol A epoxy resins, bisphenol F epoxy resins, biphenyl epoxy resins, o-cresol novolak epoxy resins, triphenolmethane epoxy resins, dicyclopentadiene epoxy resins, terpene epoxy resins and the like. Among them, those epoxy resins having a melt viscosity of 0.5 Pa•s or less at 150° C. can be more preferably used, from the viewpoints of the improvement in the flux activity, the adhesiveness, and the reduction in voids. These epoxy resins can be used alone or in admixture of two or more kinds. Also, the epoxy resin has an epoxy equivalence of preferably from 140 to 270 g/eq., more preferably from 150 to 220 g/eq., and a melting point of preferably 100° C. or lower, more preferably 80° C. or lower.

In the above-mentioned thermosetting resin composition, a phenol resin-based curing agent, such as a phenol aralkyl-based resin or a phenol novolak resin is formulated as a curing agent for the epoxy resin. Among them, those phenol resin-based curing agents having a melt viscosity of 0.5 Pa•s or less at 150° C. are more preferably used. In addition, as other curing agents, an acid anhydride-based curing agent such as methylhexahydrophthalic acid anhydride, or an amine-based curing agent such as dicyanamide can be used.

The phenol resin-based curing agent in the above-mentioned thermosetting resin composition has a hydroxyl equivalence of preferably from 60 to 200, more preferably from 80 to 180. The content of the phenol resin-based curing agent is preferably from 0.6 to 1.4 equivalence, more preferably from 0.7 to 1.1 equivalence, per one equivalence of the epoxy resin, from the viewpoint of the curing reaction.

In the above-mentioned thermosetting resin composition of the present invention, a curing accelerator for the epoxy resin can also be formulated. As the curing accelerator described above, various curing accelerators which have been conventionally known as curing accelerators for epoxy resins can be used. The curing accelerator includes, for instance, amine-based curing accelerators, phosphorus-containing curing accelerators, boron-containing curing accelerators, phosphorus-boron-containing curing accelerators, and the like. In addition, a latent curing catalyst, which comprises a curing accelerator sealed in a microcapsule, is more preferably used. These curing accelerators can be used alone or in admixture of two or more kinds.

In the above-mentioned thermosetting resin composition, other materials such as organic materials and inorganic materials can be added as occasion demands. The organic material includes silane coupling agents, titanium coupling agents, surface modifying agents, antioxidants, tackifying agents, and the like. The inorganic material includes various fillers such as alumina, silica and silicon nitride, metallic particles made of copper, silver, aluminum, nickel and solder; other pigments and dyes; and the like. The mixing ratio of the inorganic material is not particularly limited. It is preferable that the mixing ratio of the inorganic material is preferably 85% by weight or less, more preferably 80% by weight or less, of the composition, from the viewpoint of the electric bonding between the electrodes of the semiconductor element and the electrodes of the printed circuit board.

Besides the above-mentioned additives, in the above-mentioned thermosetting resin composition, there can be formulated a component such as silicone oil, silicone rubber, or a synthetic rubber-reactive diluent for the purpose of achieving low stress, or a hydrotalcite or an ion trapping agent such as bismuth hydroxide for the purpose of improvement in the reliability in the moisture tolerance reliability test. Further, an organic solvent can be also added for the purpose of adjusting flowability of the thermosetting resin composition. The organic solvent includes, for instance, toluene, xylene, methyl ethyl ketone (MEK), acetone, diacetone alcohol, and the like.

Further, it is preferable that the above-mentioned thermosetting resin composition is solid or has a high viscosity of 800 Pa•s or more at 25° C., and that the thermosetting resin composition is in a molten state at 70° C., from the viewpoints of the workability and the storage stability. Specifically, the thermosetting resin composition has a melt viscosity of preferably 100 Pa•s or less, more preferably 50 Pa•s or less, especially preferably 20 Pa•s or less at 70° C. However, it is preferable that the lower limit is 0.01 Pa•s. Here, the melt viscosity is determined by ICI rotational viscometer.

Since the above-mentioned thermosetting resin composition has the above properties and also flux activity, the thermosetting resin composition exhibits excellent effects in the productivity, the workability, the moisture tolerance reliability, and the storage stability.

The above-mentioned thermosetting resin composition can be prepared, for instance, as follows. Each of components of an epoxy resin, a phenolic resin-based curing agent, and a flux active agent represented by the general formula (1) or (2) mentioned above is formulated in a given amount, and various components such as a curing agent, a curing accelerator and various fillers are formulated as occasion demands to give a composition. The resulting composition is kneaded in a heated state with a kneader such as a universal stirring reactor, and the components are mixed and melted. Next, the molten composition is filtered with a filter, and thereafter defoamed under reduced pressure, thereby giving a desired thermosetting resin composition. For instance, in the kneading of each of the components mentioned above, an epoxy resin and a phenolic resin-based curing agent are previously mixed with heating to dissolve all solid ingredients, and thereafter the remaining components such as a flux active agent represented by the general formula (1) or (2) are added at a lower temperature, and mixed.

As shown in FIG. 1, the semiconductor device manufactured from the above-mentioned thermosetting resin composition comprises a printed circuit board 1, plural connecting electrodes 2 and a semiconductor element 3 mounted on one side of the printed circuit board 1 via the plural connecting electrodes 2. Further, a sealing resin layer 4 is formed between the printed circuit board 1 and the semiconductor element 3.

The materials and sizes for each of the printed circuit board 1, the connecting electrodes 2 and the semiconductor element 3, and the arrangements for each member are the same as those described for the First Embodiment.

As described above, the semiconductor device using the above-mentioned thermosetting resin composition is manufactured by inserting a thermosetting resin composition between a printed circuit board and a semiconductor element, and forming a sealing resin layer. Here, the thermosetting resin composition may be applied to a printed circuit board or to a semiconductor element. In the case where the thermosetting resin composition is applied to a side of the semiconductor element, the thermosetting resin composition may be applied to a wafer before dicing the wafer into individual chips, or to individual chips after dicing the wafer. A method comprising applying a thermosetting resin composition to a wafer, dicing the wafer into individual chips, and mounting the chips is preferable, from the viewpoint of improving the productivity because the resin can be applied totally on a wafer level. A method for applying a resin include any of printing method or spin coating method, and a printing sealing method utilizing vacuum pressure difference in printing method is more preferable because gas is less likely to be contained in the resin sealing layer. One example of an embodiment for the process for manufacturing a semiconductor device of the present invention will be sequentially explained on the basis of the drawings.

Figure 4:
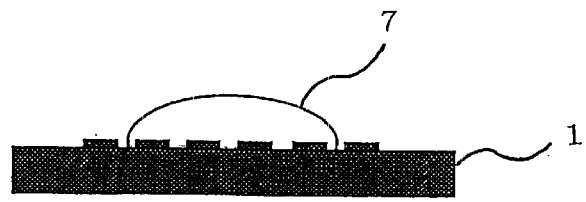
FIG. 4 is a schematic cross-sectional view showing a process for manufacturing a semiconductor device.
Figure 5:
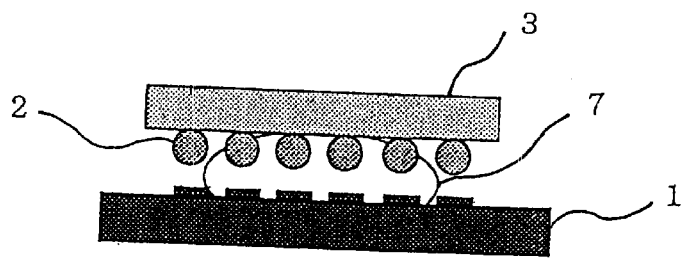
FIG. 5 is a schematic cross-sectional view showing a process for manufacturing a semiconductor device.

In an embodiment where a thermosetting resin composition is applied to a printed circuit board, first, as shown in FIG. 4, a thermosetting resin composition 7 of the present invention heated to 70° C. and in a molten state is potted on the printed circuit board 1. Next, as shown in FIG. 5, a semiconductor element 3 provided with plural spherical connecting electrodes (joint balls) 2 is mounted on given positions on a thermosetting resin composition 7. The semiconductor element 3 is pressed, and the connecting electrodes 2 of the semiconductor element 3 push out the thermosetting resin composition 7 in a molten state, so that the printed circuit board 1 is contacted with the connecting electrodes 2, and that an air gap formed between the semiconductor element 3 and the printed circuit board 1 is filled with a molten resin. The metal bonding is carried out by solder reflow, and then the resin is cured to seal the air gap, thereby forming a sealing resin layer 4. In this method, the solder reflow method may be a bonding method using a reflow furnace, or a bonding method simultaneously with mounting a chip, with heating and soldering and melting a heater portion to a temperature of equal to or higher than the melting point of the solder. As described above, the semiconductor device as shown in FIG. 1 is manufactured.

In the process for manufacturing the semiconductor device mentioned above, a case where a semiconductor element 3 provided with plural spherical connecting electrodes (joint balls) 2 is described. The present invention is not limited thereto, and a case where plural spherical connecting electrodes 2 are previously provided on a printed circuit board 1 may also be employed.

The thickness and the weight of the thermosetting resin composition 7 are appropriately set in accordance with the size of the semiconductor element 3 to be mounted and the size of the spherical connecting electrodes 2 provided on the semiconductor element 3, namely the volume occupied by a sealing resin layer 4 formed by filling and sealing an air gap formed between the semiconductor element 3 and the printed circuit board 1.

In the process for manufacturing a semiconductor device mentioned above, the heating temperature when the thermosetting resin composition 7 is melted to give a molten state is appropriately set in consideration of the heat resistance of the semiconductor element 3 and the printed circuit board 1, the melting point of the connecting electrodes 2, and the softening point and heat resistance of the thermosetting resin composition 7.

[Third Embodiment]

A third embodiment of the present invention relates to a thermosetting resin composition comprising an epoxy resin, an acid anhydride-based curing agent and a compound having the general formula (1) or (2) mentioned above, wherein the thermosetting resin composition 7 is liquid at 25° C.

The epoxy resin used in the present invention includes bisphenol A epoxy resins, bisphenol F epoxy resins, novolak epoxy resins such as phenol novolak epoxy resins and cresol novolak epoxy resins, alicyclic epoxy resins, nitrogen-containing cyclic epoxy resins such as triglycidyl isocyanurate and hydantoic epoxy resins, hydrogenated bisphenol A epoxy resins, aliphatic epoxy resins, glycidyl ether epoxy resins, bisphenol S epoxy resins, biphenyl epoxy resins from which low water supply rate cured products are mainly prepared, dicyclo-ring epoxy resins, naphthalene epoxy resins, and the like. These epoxy resins can be used alone or in admixture of two or more kinds. Among these epoxy resins, those which are alone liquid at room temperature, including bisphenol A epoxy resins, bisphenol F epoxy resins, naphthalene epoxy resins, alicyclic epoxy resins, and triglycidyl isocyanurate are more preferably used.

The above-mentioned epoxy resin may be solid or liquid at an ambient temperature (25° C.). The epoxy resin generally has an epoxy equivalence of preferably from 90 to 1000. When the epoxy resin is solid, an epoxy resin having a softening point of 160° C. or lower is preferable.

The acid anhydride-based curing agent used in the above-mentioned thermosetting resin composition includes phthalic anhydride, maleic anhydride, trimellitic acid anhydride, pyromellitic anhydride, hexahydrophthalic acid anhydride, tetrahexahydrophthalic acid anhydride, methylnadic acid anhydride, nadic acid anhydride, glutaric anhydride, methylhexahydrophthalic acid anhydride, methyltetrahydrophthalic acid anhydride, and the like. These acid anhydride-based curing agents can be used alone or in admixture of two or more kinds.

In addition, a conventionally known curing agent for the epoxy resin, for instance, an amine-based curing agent, a phenolic curing agent, a partially esterified product of the above-mentioned acid anhydride-based curing agent with an alcohol, or a carboxylic acid-based curing agent such as hexahydrophthalic acid, tetrahydrophthalic acid or methylhexahydrophthalic acid may be used together in addition to the above-mentioned acid anhydride-based curing agent. In this case, these curing agents may be used alone, as long as a mixture of the curing agent with the epoxy resin is liquid at an ambient temperature, or they may be used in admixture of two or more kinds.

The formulation ratio of the above-mentioned epoxy resin with the above-mentioned acid anhydride-based curing agent is such that the acid anhydride group in the acid anhydride-based curing agent is in a ratio of preferably from 0.5 to 1.5 equivalence, more preferably from 0.7 to 1.2 equivalence, per one equivalence of epoxy group in the epoxy resin, from the viewpoints of the curing rate of the thermosetting resin composition, the control for the glass transition temperature for the cured product, and the water resistance. Even when a curing agent other than the above-mentioned acid anhydride-based curing agent is used together with the acid anhydride-based curing agent, the formulation ratio may be adjusted in accordance with the formulation ratio (equivalent ratio) of the acid anhydride-based curing agent used.

In the above-mentioned thermosetting resin composition, a curing accelerator for the epoxy resin can also be formulated as occasion demands. As the curing accelerator mentioned above, various curing accelerators which have been conventionally known as curing accelerators for epoxy resins can be used. The curing accelerator includes, for instance, tertiary amines such as 1,8-diazabicyclo[5.4.0]undecene-7, triethylenediamine, tri-2,4,6-dimethylaminomethylphenol, imidazoles such as 2-ethyl-4-methylimidazole and 2-methylimidazole, phosphorus-containing compounds such as triphenylphosphine, tetraphenylphosphonium tetraphenylborate, tetra-n-butylphosphonium-o,o-diethylphosphorodithioate, quaternary ammonium salts, organometal salts, and derivatives thereof. These curing accelerators can be used alone or in admixture of two or more kinds.

In the above-mentioned thermosetting resin composition, other materials such as organic materials and inorganic materials can be added as occasion demands. The organic material includes silane coupling agents, titanium coupling agents, surface modifying agents, antioxidants, tackifying agents, and the like. The inorganic material includes various fillers such as alumina, silica and silicon nitride, metallic particles made of copper, silver, aluminum, nickel and solder; other pigments and dyes; and the like. The mixing ratio of the inorganic material is not particularly limited. It is preferable that the mixing ratio of the inorganic material is preferably 70% by weight or more, more preferably 65% by weight or more, of the total composition, from the viewpoints of the viscosity and the electric bonding between the electrodes of the semiconductor element and the electrodes of the printed circuit board.

Besides the above-mentioned additives, in the above-mentioned thermosetting resin composition, there can be formulated a component such as silicone oil, silicone rubber, or a synthetic rubber-reactive diluent for the purpose of achieving low stress, or a hydrotalcite or an ion trapping agent such as bismuth hydroxide for the purpose of improvement in the reliability in the moisture tolerance reliability test. In addition, various conventionally known additives such as deterioration preventives, leveling agents, defoaming agents, dyes and pigments can be properly formulated. Further, an organic solvent can be also added for the purpose of adjusting flowability of the liquid thermosetting resin composition. The organic solvent includes, for instance, toluene, xylene, methyl ethyl ketone (MEK), acetone, diacetone alcohol, and the like.

The above-mentioned thermosetting resin composition is liquid at 25° C. In the present specification, the term "liquid" refers to those exhibiting a flowability, preferably those having a melt viscosity of 800 Pa•s or less at 25° C., from the viewpoint of excellent flowability. Since the above-mentioned thermosetting resin composition is liquid, the thermosetting resin composition has an excellent flowability, so that it is effective in the prevention of air introduction.

The above-mentioned thermosetting resin composition can be prepared, for instance, as follows. Each of components of an epoxy resin, an acid anhydride-based curing agent, and a flux active agent represented by the general formula (1) or (2) mentioned above is formulated in a given amount, and various components such as a curing agent, a curing accelerator and various fillers are formulated as occasion demands to give a composition. The resulting composition was mixed and melted with a kneader such as a universal stirring reactor. Next, the molten composition is filtered with a filter, and thereafter defoamed under reduced pressure, thereby giving a desired liquid thermosetting resin composition on the above-mentioned substrate film.

As shown in FIG. 1, the semiconductor device manufactured from the above-mentioned thermosetting resin composition comprises a printed circuit board 1, plural connecting electrodes 2 and a semiconductor element 3 mounted on one side of the printed circuit board 1 via the plural connecting electrodes 2. Further, a sealing resin layer 4 is formed between the printed circuit board 1 and the semiconductor element 3.

The materials and sizes for each of the printed circuit board 1, the connecting electrodes 2 and the semiconductor element 3, and the arrangements for each member are the same as those described for the First Embodiment.

As described above, the semiconductor device using the above-mentioned thermosetting resin composition is manufactured by inserting a liquid thermosetting resin composition between a printed circuit board and a semiconductor element, and forming a sealing resin layer. One example of an embodiment for the process for manufacturing a semiconductor device of the present invention will be sequentially explained on the basis of the drawings.

First, as shown in FIG. 4, a liquid thermosetting resin composition 7 of the present invention is potted on a printed circuit board 1. Next, as shown in FIG. 5, a semiconductor element 3 provided with plural spherical connecting electrodes (joint balls) 2 is mounted on given positions on a thermosetting resin composition 7. The semiconductor element 3 is pressed, and the connecting electrodes 2 of the semiconductor element 3 push out the liquid thermosetting resin composition 7, so that the printed circuit board 1 is contacted with the connecting electrodes 2, and that an air gap formed between the semiconductor element 3 and the printed circuit board 1 is filled with a liquid thermosetting resin composition. The metal bonding is carried out by solder reflow, and then the resin is cured to seal the air gap, thereby forming a sealing resin layer 4. In this method, the solder reflow method may be a bonding method using a reflow furnace, or a bonding method simultaneously with mounting a chip, with heating and soldering and melting a heater portion to a temperature of equal to or higher than the melting point of the solder. As described above, the semiconductor device as shown in FIG. 1 is manufactured.

In the process for manufacturing the semiconductor device mentioned above, a case where a semiconductor element 3 provided with plural spherical connecting electrodes (joint balls) 2 is described. The present invention is not limited thereto, and a case where plural spherical connecting electrodes 2 are previously provided on a printed circuit board 1 may also be employed.

The thickness and the weight of the resin sealing layer 4 made of the thermosetting resin composition are appropriately set in accordance with the size of the semiconductor element 3 to be mounted and the size of the spherical connecting electrodes 2 provided on the semiconductor element, namely the volume occupied by a sealing resin layer 4 formed by filling and sealing an air gap formed between the semiconductor element 3 and the printed circuit board 1.

[Fourth Embodiment]

A fourth embodiment of the present invention relates to a thermosetting resin composition comprising:

(A) an epoxy resin having at least two epoxy groups in its molecule, (B) a curing agent, (C) a compound having the general formula (1) or (2), and (D) a microcapsulated curing accelerator comprising a core portion comprising a curing accelerator, and a shell portion formed so as to cover the core portion, the shell portion comprising a polymer having a structural unit represented by the following general formula (3):

$$-N(R^5)-CO-N(R^6)- \qquad (3)$$

wherein each of $R^5$ and $R^6$ is hydrogen atom or a monovalent organic group, wherein $R^5$ and $R^6$ may be identical or different, wherein the thermosetting resin composition has a reaction exothermic peak of 180° to 250° C. with a programming rate of 10° C./min in a differential scanning calorimetric determination.

As the epoxy resin of the component (A) used in the above-mentioned thermosetting resin composition, any of those having at least two epoxy groups in its molecule can be used without particular limitation. The epoxy resin includes, for instance, bisphenol A epoxy resins; bisphenol F epoxy resins; novolak epoxy resins such as phenol novolak epoxy resins and cresol novolak epoxy resins; alicyclic epoxy resins; nitrogen-containing cyclic epoxy resins such as triglycidyl isocyanurate and hydantoic epoxy resins; hydrogenated bisphenol A epoxy resins; aliphatic epoxy resins; glycidyl ether epoxy resins; bisphenol S epoxy resins; biphenyl epoxy resins from which low water supply rate cured products are mainly prepared, epoxy resins containing dicyclo-ring; naphthalenic epoxy resins; and the like. These epoxy resins can be used alone or in admixture of two or more kinds.

Among these epoxy resins, bisphenol A epoxy resins, bisphenol F epoxy resins, naphthalenic epoxy resins, alicyclic epoxy resins and triglycidyl isocyanurate, which are alone liquid at room temperature, are more preferably used.

The above-mentioned epoxy resin may be solid or liquid at an ambient temperature. It is preferable that the epoxy resin generally has an epoxy equivalency of from 90 to 1000 g/eq., from the viewpoints of the mechanical strength of the cured product of the thermosetting resin composition and the control of the glass transition temperature. In addition, in the case where the epoxy resin is solid, it is preferable that the epoxy resin has a softening point of from 50° to 160° C., from the viewpoint of the temperature range for maintaining the latent property of the latent curing accelerator.

The curing agent of the component (B) is not particularly limited, and various curing agents can be used, as long as they act as a curing agent for the above-mentioned epoxy resin. As the curing agent for the above-mentioned epoxy resin, a phenolic curing agent is generally used, and various other curing agents such as acid anhydride-based curing agents, amines and compounds having benzoxazine ring can also be used. These curing agents can be used alone or in admixture of two or more kinds.

The phenolic curing agent includes, for instance, cresol novolak resin, phenol novolak resins, phenolic resins containing dicyclopentadiene-ring, phenol aralkyl resins, naphthol, and the like. These phenolic curing agents can be used alone or in admixture of two or more kinds.

The mixing ratio of the epoxy resin to the phenolic curing agent is such that reactive hydroxyl group in the phenolic curing agent is preferably from 0.5 to 1.5 equivalent, more preferably 0.7 to 1.2 equivalent, per one equivalent of epoxy group in the epoxy resin, from the viewpoints of the thermosetting property, the heat resistance, and the moisture tolerance reliability. As to those cases where a curing agent other than the phenolic curing agent is used, the mixing ratio is adjusted in accordance with the mixing ratio (equivalent ratio) of the case where the phenolic curing agent is used.

The microcapsulated curing accelerator of the component (D) used in the above-mentioned thermosetting resin composition is a microcapsulated curing accelerator having a core-shell structure, in which a core portion comprising any of various curing accelerators is coated with a shell portion comprising a polymer having a structural unit represented by the general formula (3):

$$-N(R^5)-CO-N(R^6)- \qquad (3)$$

wherein each of $R^5$ and $R^6$ is hydrogen atom or a monovalent organic group, wherein $R^5$ and $R^6$ may be identical to or different from each other. Among the above microcapsulated curing accelerators, those in which a reactive amino group existing in the shell portion is blocked are preferable.

In addition, in the thermosetting resin composition comprising the above-mentioned microcapsulated curing accelerator, the shell portion serves to cut off a physical contact between the core portion and the curing agent, so that the gelation of the thermosetting resin composition is suppressed in the soldering step, thereby giving excellent solderability. In addition, there are some advantages that undesired curing of the thermosetting resin composition which may be caused during storage or the like can be suppressed, so that the operable time becomes consequently very long, and that the thermosetting resin composition has excellent storage stability.

In the above-mentioned microcapsulated curing accelerator, the curing accelerator which is incorporated as a core portion is not particularly limited, and any of conventional ones can be used, as long as the curing accelerator has an action for accelerating the curing reaction. In this case, those curing accelerators which are liquid at room temperature are preferable, from the viewpoints of the workability during the preparation of the microcapsules and the properties of the resulting microcapsules. Here, the phrase "liquid at room temperature" encompasses not only those where the curing accelerator itself is liquid at room temperature (25° C.) but also those where the curing accelerator, which may be solid at room temperature, is formed into a liquid by dissolving or dispersing in an optional organic solvent or the like.

The curing accelerator constituting the core portion includes, for instance, tertiary amines such as 1,8-diazabicyclo[5.4.0]undecene-7, triethylenediamine, and tri-2,1,6-dimethylaminomethylphenol; imidazoles such as 2-ethyl-4-methylimidazole and 2-methylimidazole; phosphorus-containing compounds such as triphenylphosphine, tetraphenylphosphoniumtetraphenylborate, and tetra-n-butylphosphonium-o,o-diethylphosphorodithioate; quaternary ammonium salts; organometallic salts; and derivatives thereof. These curing accelerators can be used alone or in admixture of two or more kinds. Among them, the above-mentioned imidazole compounds and organophosphorus compounds are especially preferably used, from the viewpoints of easiness in the preparation of the curing accelerator-containing microcapsules and easiness in handling.

The polymer having a structural unit represented by the above-mentioned general formula (3) is obtained by, for instance, poly-addition reaction of a polyisocyanate with a polyamine. Alternatively, the polymer is obtained by a reaction of a polyisocyanate with water.

The above-mentioned polyisocyanate may be any compound, as long as it has two or more isocyanate groups in its molecule. Concrete examples of the polyisocyanate include diisocyanates such as m-phenylene diisocyanate, p-phenylene diisocyanate, 2,4-tolylene diisocyanate, 2,6-tolylene diisocyanate, naphthalene-1,4-diisocyanate, diphenylmethane-4,4'-diisocyanate, 3,3'-dimethoxy-4,4'-biphenyl diisocyanate, 3,3'-dimethyldiphenylmethane-4,4'-diisocyanate, xylylene-1,4-diisocyanate, 4,4'-diphenylpropane diisocyanate, trimethylene diisocyanate, hexamethylene diisocyanate, propylene-1,2-diisocyanate, butylene-1,2-diisocyanate, cyclohexylene-1,2-diisocyanate, and cyclohexylene-1,4-diisocyanate; triisocyanates such as asp-phenylene diisothiocyanate, xylylene-1,4-diisothiocyanate, and ethylidyne diisothiocyanate; tetraisocyanates such as 4,4'-dimethyldiphenylmethane-2,2',5,5'-tetraisocyanate; isocyanate prepolymers such as an adduct of 2,4-hexamethylene diisocyanate and Benzcatechol, an adduct of tolylene diisocyanate and hexanetriol, an adduct of tolylene diisocyanate and trimethylolpropane, an adduct of xylylene diisocyanate and trimethylolpropane, an adduct of hexamethylene diisocyanate and trimethylolpropane, and trimers of aliphatic polyisocyanates, such as triphenyldimethylene triisocyanate, tetraphenyltrimethylene tetraisocyanate, pentaphenyltetramethylene pentaisocyanate, lysine isocyanate, and hexamethylene diisocyanate, and the like. These polyisocyanates can be used alone or in admixture of two or more kinds.

Among the above-mentioned polyisocyanates, any of the trivalent isocyanate prepolymers selected from the adduct of tolylene diisocyanate and trimethyloipropane or the adduct of xylylene diisocyanate and trimethylolpropane is preferably used, from the viewpoints of the film-forming property during the preparation of the microcapsule and the mechanical strength. In addition, triphenyldimethylene triisocyanate can be also used as a preferable polyisocyanate.

The polyamine to be reacted with the above-mentioned polyisocyanate may be any compound that has two or more amino groups in its molecule. Concrete examples of the polyamine include diethylenetriamine, triethylenetetramine, tetraethylenepentamine, 1,6-hexamethylenediamine, 1,8-octamethylenediamine, 1,12-dodecamethylenediamine, o-phenylenediamine, m-phenylenediamine, p-phenylenediamine, o-xylylenediamine, m-xylylenediamine, p-xylylenediamine, menthanediamine, bis(4-amino-3-methylcyclohexyl)methane, isophoronediamine, 1,3-diaminocyclohexane, spiro-acetal-based diamines, and the like. These polyamines can be used alone or in admixture of two or more kinds.

In addition, in the reaction of the above-mentioned polyisocyanate with water, first, an amine is formed by hydrolysis of a polyisocyanate, and the resulting amine is reacted with unreacted isocyanate group (so-called "self poly-addition reaction"), thereby forming a polymer having a structural unit represented by the general formula (3) mentioned above.

Further, the polymer capable of forming the above-mentioned shell portion includes, for instance, a polyurethane-polyurea prepared from a polyhydric alcohol together with the above-mentioned polyisocyanate to incorporate a urea bond in the structural unit.

The polyhydric alcohol may be aliphatic, aromatic or alicyclic. The polyhydric alcohol includes, for instance, catechol, resorcinol, 1,2-dihydroxy-4-methylbenzene, 1,3-dihydroxy-5-methylbenzene, 3,4-dihydroxy-1-methylbenzene, 3,5-dihydroxy-1-methylbenzene, 2,4-dihydroxyethylbenzene, 1,3-naphthalenediol, 1,5-naphthalenediol, 2,7-naphthalenediol, 2,3-naphthalenediol, o,o'-biphenol, p,p'-biphenol, bisphenol A, bis(2-hydroxyphenyl)methane, xylylenediol, ethylene glycol, 1,3-propylene glycol, 1,4-butylene glycol, 1,5-pentanediol, 1,6-hexanediol, 1,7-heptanediol, 1,8-octanediol, 1,1,1-trimethylolpropane, hexanetriol, pentaerythritol, glycerol, sorbitol, and the like. These polyhydric alcohols can be used alone or in admixture of two or more kinds.

Concrete examples of $R^5$ and $R^6$ of the above-mentioned general formula (3) include, for instance, hydrogen atom; a monovalent organic group, such as an alkyl group having 1 to 3 carbon atoms and an aryl group; and the like.

In addition, the shell portion may contain, in addition to the polymer having the structural unit represented by the above-mentioned general formula (3), a polymer having a urethane bond, a thermoplastic polymer, or the like.

The polymer having the structural unit represented by the above-mentioned general formula (3) is contained in the shell portion in an amount of preferably from 40 to 100% by weight, more preferably from 60 to 100% by weight.

The above-mentioned microcapsulated curing accelerator can be prepared by, for instance, following the three-step process described below.

[First Step]

A core component curing accelerator is dissolved or finely dispersed in a polyisocyanate, which is a raw material for the shell portion to form an oil phase. Next, an O/W type (oil phase/water phase type) emulsion is prepared by dispersing the above-mentioned oil phase in a oil droplet form in an aqueous medium (water phase) containing a dispersion stabilizer. Subsequently, a polyamine is added to the water phase of the above-mentioned O/W type emulsion to be dissolved, thereby carrying out poly-addition reaction by the interfacial polymerization of the polyamine with the polyisocyanate in the oil phase. Alternatively, the above-mentioned O/W type emulsion is heated, so that the polyisocyanate in the oil phase is reacted with water at the interface with the water phase to form an amine, and subsequently the resulting amine is subjected to a self poly-addition reaction. As described above, a microcapsule comprising a polyurea polymer, preferably a polyurea having a structural unit represented by the above-mentioned general formula (3) in its molecule as a shell portion is prepared, and a liquid dispersing the microcapsulated curing accelerator is obtained.

On the other hand, when the core component is prepared by dissolving a solid curing accelerator in an organic solvent, an S/O/W (solid phase/oil phase/water phase) emulsion is prepared. In addition, this emulsion type is a case where the curing accelerator is lipophilic. In a case where the curing accelerator is hydrophilic, the above-mentioned emulsion type is less likely to be prepared. In such a case, an O/O (oil phase/oil phase) emulsion type or an S/O/O (solid phase/oil phase/oil phase) emulsion type can be prepared by adjusting its solubility, and the interfacial polymerization may be carried out therewith.

The organic solvent used in this case is not particularly limited, as long as the organic solvent is liquid at room temperature, and those organic solvents which do not dissolve the shell portion must be selected. Concretely, an organic solvent such as ethyl acetate, methyl ethyl ketone, acetone, methylene chloride, xylene, toluene or tetrahydrofuran; or an oil such as phenylxylylethane and a dialkyl-naphthalene can be used.

[Second Step]

A blocking agent is added to the dispersion of microcapsules obtained in the first step, to dissolve or disperse the blocking agent in the dispersion. During this step, it is effective to add the above-mentioned blocking agent after once removing the dispersion stabilizer and the unreacted amine in the water phase of the dispersion of microcapsules by such means as centrifugation.

[Third Step]

The dispersion of the microcapsules of which amino groups are blocked with the blocking agent in the second step is subjected to such a treatment as centrifugation or filtration to remove an excess blocking agent, and thereafter dried, thereby giving a powdery microcapsulated curing agent.

In the above-mentioned first step, the dispersion stabilizer to be added to the aqueous medium (water phase) includes water-soluble polymers such as polyvinyl alcohols and hydroxymethyl cellulose; surfactants such as anionic surfactants, nonionic surfactants and cationic surfactants; and the like. In addition, hydrophilic inorganic colloidal substances such as colloidal silica and mineral clays; and the like can be also used. It is preferable that the amount of these dispersion stabilizers is adjusted to 0.1 to 10% by weight in the water phase.

The blocking agent to be used in the above-mentioned second step is not particularly limited, as long as the blocking agent is a compound which is reactive with amino group. The blocking agent includes, for instance, compounds capable of forming a covalent bond by the reaction with amino group, such as epoxy compounds, aldehyde compounds, acid anhydrides, ester compounds, and isocyanate compounds. The blocking agent may further include acidic compounds capable of forming a salt by neutral reaction with amino group, such as organic carboxylic acids such as acetic acid, formic acid, lactic acid, and succinic acid; organic sulfonic acids such asp-toluenesulfonic acid, 2-naphthalenesulfonic acid, and dodecylbenzenesulfonic acid; phenolic compounds; inorganic acids such as boric acid, phosphoric acid, nitric acid, nitrous acid, and hydrochloric acid; solid substances having acidic surfaces such as silica and Aerozil; and the like. Among these compounds, the above-mentioned acidic compounds are preferably used as a compound effectively blocking amino group existing on the surface of the shell portion and in the internal of the shell portion, and formic acid and organic sulfonic acids are especially preferably used.

The above-mentioned blocking agent is added in an equimolar amount to the amino groups existing on the surface of the shell portion and in the internal of the shell portion. Practically speaking, in a case, for instance, where the acidic compound is used as a blocking agent, the blocking agent can be added by a method comprising adding an acidic substance (acidic compound) to a dispersion immediately after the preparation of microcapsules (immediately after interfacial polymerization); adjusting the pH of the dispersion from basic to acidic, preferably to a pH of 2 to 5; and thereafter removing an excess acidic compound by such means as centrifugation or filtration.

In addition, in the second step, a technique of removing unreacted free amines or neutralizing residual amino groups by applying the dispersion of microcapsules on an acidic cationic exchange resin column can be employed.

The average particle size of the resulting microcapsulated curing accelerator is not particularly limited. For instance, it is preferable that the average particle size is adjusted to a range of from 0.05 to 500 µm, more preferably from 0.1 to 30 µm, from the viewpoint of homogeneous dispersibility. The shape of the above-mentioned microcapsulated curing accelerator is preferably spherical, from the viewpoint of dispersibility, but the shape may be elliptic. In the case where the shape of the microcapsules is not spherical and one of which particle size is not evenly determined as in the case of elliptic or oblate, a simple average value of its longest diameter and shortest diameter is defined as an average particle size.

Further, in the above-mentioned microcapsulated curing accelerator, the amount of the curing accelerator incorporated is adjusted to preferably from 5 to 80% by weight of the entire amount of the microcapsule, especially preferably adjusted to 10 to 60% by weight, from the viewpoints of the reactivity in the curing reaction, the isolation of the core portion, and the mechanical strength.

In addition, the ratio of the thickness of the shell portion to the particle size of the above-mentioned microcapsulated curing accelerator is preferably adjusted to 3 to 25%, especially preferably adjusted to 5 to 25%, from the viewpoint of the mechanical strength.

The formulation amount of the microcapsulated curing accelerator of the component (D) in the thermosetting resin composition may be properly selected in a ratio so as to give a desired curing rate, from the viewpoints of the curing rate, the solderability, and the adhesiveness of the thermosetting resin composition. For instance, as an index of the curing rate, the amount used can be readily determined with measuring the gelation time on a hot plate. Generally, the formulation amount of the microcapsulated curing accelerator is adjusted to 0.1 to 40 parts by weight, based on 100 parts by weight of the curing agent, especially preferably 1 to 20 parts by weight. When the formulation amount of the microcapsulated curing accelerator is less than 0.1 parts by weight, the curing rate is too slow, so that the curing time becomes long, and that the glass transition temperature of the cured product of the thermosetting resin composition is drastically lowered, thereby risking impaired reliability of the electronic part devices using the cured product. On the other hand, when the formulation amount exceeds 40 parts by weight, the curing rate is too fast, thereby risking impaired solderability and adhesiveness.

It is preferable that the above-mentioned thermosetting resin composition has a reaction exothermic peak in the range of 180° to 250° C. as determined by the differential scanning calorimetric determination at a programming rate of 10° C./minute.

Here, the differential scanning calorimetric determination refers to a process of recording energy required, against time or temperature, for keeping the temperature difference between a sample and a standard substance to be zero, under the same conditions with adjustment of heating or cooling.

In this embodiment, since the constituent of the shell portion in the microcapsulated curing accelerator is properly selected, the reaction exothermic peak, as expressed by the differential scanning calorimetric determination of the thermosetting resin composition comprising the microcapsulated curing accelerator, can be controlled. Specifically, the thermally curing reaction of the thermosetting resin composition comprising the microcapsulated curing accelerator of the present invention is caused by initiation of an exothermic reaction due to release of the curing accelerator along with the swelling of the shell during heating from internal of the capsule into the thermosetting resin, and by acceleration of the reaction by decomposition of the shell owing to the heat of reaction. Therefore, since the cross-linking density of the shell portion, more specifically the number of functional groups of the isocyanate monomers which are constituents of the shell portion, the number of aromatic rings, and the like are properly selected, the heat of reaction of the thermosetting resin composition comprising the curing accelerator can be properly controlled. When the thermosetting resin has a reaction exothermic peak at lower than 180° C., as determined by the differential scanning calorimetric determination, the thermosetting resin has a reaction exothermic peak lower than, for instance, the melting point of 63 Sn-37 Pb solder (melting point: 183° C.) or the melting point of Sn—Ag solder (melting point: 220° C.). Therefore, the viscosity of the resin increases before subjecting the resin to soldering in reflow, or the gelation is caused, so that the solderability is undesirably lowered. Generally, at present, it would be very difficult to adjust the reaction exothermic peak of the thermosetting resin composition comprising the epoxy resin composition comprising the microcapsulated curing accelerator to 250° C. or higher, from the viewpoint of the heat resistance of the shell.

In the above-mentioned thermosetting resin composition, other materials, including organic materials and inorganic materials can be added as occasion demands. The organic material includes silane coupling agents, titanium coupling agents, surface modifying agents, antioxidants, tackifying agents, and the like. The inorganic material includes various fillers such as alumina, silica and silicon nitride, metallic particles made of copper, silver, aluminum, nickel and solder; other pigments and dyes; and the like. The formulation ratio of the inorganic material is not particularly limited. It is preferable that the formulation ratio of the inorganic material is from 0 to 70% by weight, preferably from 0 to 65% by weight, from the viewpoints of the control of the viscosity of the thermosetting resin composition and the electric connection between the semiconductor element and the printed circuit board.

In the above-mentioned thermosetting resin composition, besides the other auxiliary agents mentioned above, components such as silicone oils, silicone rubbers, synthetic rubbers, and reactive diluents can be formulated in order to achieve low compression; and ion trapping agents such as hydrotalcites and bismuth hydroxide can be properly formulated for the purpose of improving the reliability in the moisture tolerance resistance test. In addition, various conventionally known additives such as a deterioration preventive, a leveling agent, a defoaming agent, a pigment, a dye, and the like can be properly formulated.

The form of the above-mentioned thermosetting resin composition may be liquid or solid at room temperature (25° C.), or the thermosetting resin composition may be worked into a sheet-like form. In the case where the thermosetting resin composition is liquid at room temperature, the thermosetting resin composition may be applied to a printed circuit board with a dispenser. In the case where the thermosetting resin composition is solid at room temperature, the thermosetting resin composition may be applied to a printed circuit board by melting the thermosetting resin composition into a molten state with a heating-type dispenser.

In addition, in the case where the above-mentioned thermosetting resin composition is worked into a sheet-like form, the thermosetting resin composition can be formed into a sheet by melting and extruding the resin composition on a substrate film. Further, in order to facilitate the formation of the sheet, a rubber component or the like may be added to the thermosetting resin composition.

As the above-mentioned rubber component, for instance, acrylonitrile-butadiene copolymer (NBR) is favorably used, and other copolymer components can be further used together therewith. Other copolymer components include, for instance, hydrogenated acrylonitrile-butadiene rubber, acrylic acid, acrylates, styrene, methacrylic acid, and the like. Among them, acrylic acid or methacrylic acid is preferable, from the viewpoint of giving excellent adhesion to a metal or plastic. In addition, the amount of acrylonitrile bonded in the above-mentioned NBR is especially preferably from 10 to 50% by weight, more preferably 15 to 40% by weight.

The above-mentioned thermosetting resin composition can be, for instance, prepared as follows. Specifically, each of the components of the epoxy resin, the curing agent, the compound represented by the general formula (1) or (2), and the microcapsulated curing accelerator is formulated in a given amount, and the mixture is blended in a molten state by kneading with a kneader such as a universal stirring reactor with heating. Next, a desired thermosetting resin composition can be prepared by filtering the molten mixture with a filter, and thereafter defoaming the filtrate under a reduced pressure. Here, in order to adjust the fluidity of the thermosetting resin composition, an organic solvent can be added. The organic solvent includes, for instance, toluene, xylene, methyl ethyl ketone (MEK), acetone, diacetone alcohol and the like. These organic solvents can be used alone or in admixture thereof.

Further, the present invention relates to a semiconductor device comprising:
 a printed circuit board,
 a semiconductor element, and
 the above-mentioned thermosetting resin composition,
  wherein a gap formed between the printed circuit board and the semiconductor element is sealed by the thermosetting resin composition.

As shown in FIG. 1, the semiconductor device manufactured by using the thermosetting resin composition of the present invention comprises a printed circuit board 1, plural connecting electrodes 2 and a semiconductor element 3 mounted on one side of the printed circuit board 1 via plural connecting electrodes 2. A sealing resin layer 4 is formed between the printed circuit board 1 and the semiconductor element 3.

The materials and sizes for each of the printed circuit board 1, the connecting electrodes 2 and the semiconductor element 3, and the arrangements for each member are the same as those described for the First Embodiment.

In the semiconductor device manufactured by using the above-mentioned thermosetting resin composition, the semiconductor device comprising a printed circuit board, plural connecting electrodes and a semiconductor element mounted on one side of the printed circuit board via plural connecting electrodes, the semiconductor device is manufactured by inserting a thermosetting resin composition between a printed circuit board and a semiconductor element, and melting the thermosetting resin composition to form a sealing resin layer. One example of an embodiment for the process for manufacturing a semiconductor device of the present invention will be sequentially explained on the basis of the drawings.

First, as shown in FIG. 4, a thermosetting resin composition 7 of the present invention is placed on a printed circuit board 1. Next, as shown in FIG. 5, a semiconductor element 3 provided with plural spherical connecting electrodes (joint balls) 2 is mounted on given positions on a thermosetting resin composition 7. The thermosetting resin composition 7 is melted on a heated stage to give a molten state, and the connecting electrodes 2 of the semiconductor element 3 push out the molten thermosetting resin composition 7, so that the printed circuit board 1 is contacted with the connecting electrodes 2, and that an air gap formed between the semiconductor element 3 and the printed circuit board 1 is filled with a thermosetting resin composition 7 in a molten state. The metal bonding is carried out by solder reflow, and then the thermosetting resin composition 7 is cured to seal the air gap, thereby forming a sealing resin layer 4. In this method, the solder reflow method may be a bonding method using a reflow furnace, or a bonding method simultaneously with mounting a chip, with heating and soldering and melting a heater portion to a temperature of equal to or higher than the melting point of the solder. As described above, the semiconductor device as shown in FIG. 1 is manufactured.

In the process for manufacturing the semiconductor device mentioned above, a case where a semiconductor element 3 provided with plural spherical connecting electrodes 2 is described. The present invention is not limited thereto, and a case where plural spherical connecting electrodes 2 are previously provided on a printed circuit board 1 may also be employed.

The thickness and the weight of the thermosetting resin composition 7 are appropriately set in accordance with the size of the semiconductor element 3 to be mounted and the size of the spherical connecting electrodes 2 provided on the semiconductor element 3, namely the volume occupied by a sealing resin layer 4 formed by filling and sealing an air gap formed between the semiconductor element 3 and the printed circuit board 1.

In the process for manufacturing a semiconductor device mentioned above, the heating temperature when the thermosetting resin composition 7 is melted to give a molten state is appropriately set in consideration of the heat resistance of the semiconductor element 3 and the printed circuit board 1, the melting point of the connecting electrodes 2, and the softening point and heat resistance of the thermosetting resin composition 7.

EXAMPLES

Next, the present invention will be described in further detail by means of the following Examples, and can be of course subject to various modifications and applications without departing from the gist of the present invention.

Example A

Prior to carrying out Examples and Comparative Example, the following epoxy resins, carboxylic acid derivative, phenolic resin, acrylonitrile-butadiene copolymer, curing accelerator and inorganic filler were prepared.

[Epoxy Resin (a1)]
Bisphenol A epoxy resin (epoxy equivalence: 185 g/eq., liquid at room temperature, viscosity: 0.1 Poise or less at 150° C.)

[Epoxy Resin (a2)]
Triphenolmethane epoxy resin (epoxy equivalence: 170 g/eq., softening point: 63° C., viscosity: 0.8 Poise at 150° C.)

[Flux Active Agent (b1)]
Di-n-propyl vinyl ether adipate

[Flux Active Agent (b2)]
Trimellitic acid-1,2,4-tri-2-ethylhexyl vinyl ether

[Flux Active Agent (b3)]
Tris(2-carboxyethyl) isocyanurate-tri-n-propyl vinyl ether

[Acrylonitrile-Butadiene]
Mooney viscosity: 50
Content of binding acrylonitrile: 30% by weight

[Phenolic Resin]
Phenolic novolak resin (hydroxyl group equiv.: 104 g/eq., softening point: 60° C., viscosity: 0.4 Poise at 150° C.)

[Curing Accelerator]
Microcapsulated triphenylphosphine (shell/catalyst ratio: 50/50 (by weight))

[Inorganic Filler]
Spherical silica (average particle size: 0.5 μm, maximal particle size: 1.0 μm)

The evaluation methods for the semiconductor devices in each of Examples and Comparative Example are collectively given hereinbelow.

(1) Initial Electric Conductivity Test and Electric Conductivity Test after Moisture Absorption and Soldering Electric resistances of the semiconductor devices were determined at room temperature and 125° C. with a digital multimeter "TR6847" commercially available from Advantest. Those evaluated as "acceptable" for the initial electric conductivity test and the electric conductivity test after moisture absorption and soldering are when the connecting electric resistance value between 2 bumps is 20 mm Ω or less. The evaluation results were expressed as the number of defective products per 8 semiconductor devices.

(2) Electric Conductivity by Thermal Shock Test (TST)

The procedures for the semiconductor device were carried out by using a thermal shock device, wherein one cycle comprises keeping the semiconductor device at −50° C. for 5 minutes, and thereafter keeping it at 125° C. for 5 minutes. The electric conductivity of the semiconductor device after carrying out 1000 cycles (electric conductivity after 1000 cycles of TST), and that of the semiconductor device after carrying out 2000 cycles (electric conductivity after 2000 cycles of TST) were measured, and expressed as the number of defective products per 8 semiconductor devices. The electric conductivity was evaluated by determining the electric resistance at room temperature and 125° C. using a digital multimeter "TR6847," commercially available from Advantest, and those having connecting electric resistances between 2 bumps of 50 mmΩ or more are counted as defective products.

Examples 1A to 5A and Comparative Example 1A

Each of components shown in Table 1 was mixed in a ratio shown in the table with toluene to dissolve the components. The resulting mixed solution was applied to a polyester film previously treated with a releasing agent. Next, the above-mentioned mixed solution-applied polyester film was dried at 120° C., and toluene was removed therefrom to prepare a desired sheet-like thermosetting resin composition having a thickness of 80 μm formed on the above-mentioned polyester film.

A semiconductor device was manufactured in accordance with the method for manufacturing a semiconductor device described above by using each of the sheet-like thermosetting resin compositions of Examples 1A to 5A and Comparative Example 1A obtained in the manner described above. Specifically, as shown in FIG. 2, a sheet-like thermosetting resin composition 7 was placed on a printed circuit board 1 (glass epoxy board, thickness: 1 mm). As shown in FIG. 3, a semiconductor element 3 (thickness: 600 μm, size: 13 mm×9 mm) was then provided with connecting electrodes 2 (eutectic solder, melting point: 183° C., electrode height: 120 μm) on given positions of the sheet-like thermosetting resin composition 7. Thereafter, the sheet-like thermosetting resin composition was melted under the conditions of a heating temperature of 150° C., a load of 1.5 gf/number of electrodes, and 3 seconds, thereby filling an air gap between the printed circuit board 1 and the semiconductor element 3 with a molten resin. Subsequently, the filled resin was subjected to solder reflow (Jedec condition)

and resin curing (conditions of 150° C. for 30 minutes), thereby manufacturing a semiconductor of which air gap was sealed with a sealing resin layer 4 as shown in FIG. 1 (8 semiconductor devices were prepared for each Examples and Comparative Example). Each of the resulting semiconductor devices was subjected to initial electric conductivity test. Further, each of the semiconductor devices was allowed to absorb moisture under the environmental conditions of 30° C., 60% RH for 168 hours, and then subjected to solder reflow (Jedec condition), and thereafter to electric conductivity test. The results are shown in Table 1. Furthermore, each of the semiconductor devices was subjected to 1000 or 2000 cycles of thermal shock test (TST: one cycle comprising keeping at −50° C. for 5 minutes, and then keeping at 125° C. for 5 minutes), and thereafter subjected to an electric conductivity test (8 semiconductor devices for each Example or Comparative Example). The results are shown in Table 1.

TABLE 1

| Composition | Examples | | | | | Comp. Examples |
|---|---|---|---|---|---|---|
| (carts by weight) | 1A | 2A | 3A | 4A | 5A | 1A |
| Epoxy Resin (a1) | 4.0 | 4.0 | 4.0 | 4.0 | 4.0 | 4.0 |
| Epoxy Resin (a2) | 6.0 | 6.0 | 6.0 | 6.0 | 6.0 | 6.0 |
| Flux Active Agent (b1) | 0.51 | 0 | 0 | 0.25 | 0.87 | 0 |
| Flux Active Agent (b2) | 0 | 0.51 | 0 | 0 | 0 | 0 |
| Flux Active Agent (b3) | 0 | 0 | 0.51 | 0 | 0 | 0 |
| Phenol Novolak Resin | 5.92 | 5.92 | 5.92 | 5.92 | 5.92 | 5.92 |
| Acrylonitrile-Butadiene-Methacrylic Acid | 0.5 | 0.5 | 0.5 | 0.5 | 0.5 | 0.5 |
| Curing Accelerator | 0.12 | 0.12 | 0.12 | 0.12 | 0.12 | 0.12 |
| Inorganic Filler | 0 | 0 | 0 | 0 | 4.35 | 0 |
| Test Results | | | | | | |
| Chip Mounting Load (g/bumps) | 1.5 | 1.5 | 1.5 | 1.5 | 1.5 | 1.5 |
| Initial Electric Conductivity Test (No. of Defective/Total No.) | 0/8 | 0/8 | 0/8 | 0/8 | 0/8 | 8/8 |
| Electric Conductivity Test after Moisture Absorption and Soldering (No. of Defective/Total No.) | 0/8 | 0/8 | 0/8 | 0/8 | 0/8 | — |
| Electric Conductivity Test after 1000 Cycles of TST (No. of Defective/Total No.) | 0/8 | 0/8 | 0/8 | 0/8 | 0/8 | — |
| Electric Conductivity Test after 2000 Cycles of TST (No. of Defective/Total No.) | 0/8 | 0/8 | 0/8 | 0/8 | 0/8 | — |

It was confirmed from Table 1 that Examples 1A to 5A showed no generation of defectiveness in all of the tests of the initial electric conductivity test, the electric conductivity test after moisture absorption and soldering, the electric conductivity test after 1000 cycles of TST, and the electric conductivity test after 2000 cycles of TST. On the other hand, Comparative Example showed generation of defectiveness in the initial electric conductivity test or the electric conductivity test after 2000 cycles of TST. Therefore, it was confirmed that the semiconductor device manufactured by using the sheet-like thermosetting resin composition of the present invention showed stable electric conductivities in the initial electric conductivity and the electric conductivities after stress tests such as TST and moisture absorption and soldering.

Example B

Prior to carrying out Examples and Comparative Example, the following epoxy resins, phenolic resin-based curing agent, flux active agents, curing accelerator and inorganic filler were prepared.
[Epoxy Resin (a1)]
Bisphenol A epoxy resin (epoxy equivalence: 185 g/eq., liquid at room temperature, viscosity: 0.1 Poise or less at 150° C.)
[Epoxy Resin (a2)]
Triphenolmethane epoxy resin (epoxy equivalence: 170 g/eq., softening point: 63° C., viscosity: 0.8 Poise at 150° C.)
[Phenolic Resin-Based Curing Agent]
Phenolic novolak resin (hydroxyl group equiv.: 104 g/eq., softening point: 60° C., viscosity: 0.4 Poise at 150° C.)
[Flux Active Agent (b1)]
Di-n-propyl vinyl ether adipate
[Flux Active Agent (b2)]
Trimellitic acid-1,2,4-tri-2-ethylhexyl vinyl ether
[Flux Active Agent (b3)]
Tris(2-carboxyethyl) isocyanurate-tri-n-propyl vinyl ether
[Curing Accelerator]
Microcapsulated triphenylphosphine (shell/catalyst ratio: 50/50 (by weight))
[Inorganic Filler]
Spherical silica (average particle size: 0.5 μm, maximal particle size: 1.0 μm)

The evaluation methods for the semiconductor devices in each of Examples and Comparative Example are collectively given hereinbelow.
(1) Initial Electric Conductivity Test and Electric Conductivity Test after Moisture Absorption and Soldering
The same procedures as in "Initial Electric Conductivity Test and Electric Conductivity Test after Moisture Absorption and Soldering" in Example A were carried out.
(2) Electric Conductivity by Thermal Shock Test (TST)
The same procedures as in "Electric Conductivity by TST" in Example A were carried out.

Examples 1B to 5B and Comparative Example 1B

Each of components shown in Table 2 was formulated in a ratio shown in the table, and kneaded in a universal stirring vessel to melt-knead the mixture. Next, the melt-kneaded mixture was filtered with a 300 mesh filter at 80° C., and thereafter the filtrate was defoamed under reduced pressure at 80° C. for 30 minutes, and the product was cooled to room temperature, to give a desired thermosetting resin composition. Each of the resulting thermosetting resin compositions was solid at 25° C. The melt viscosity as determined by ICI rotational viscometer was determined at 70° C., and the results are shown in Table 2. Here, the kneading conditions are as follows.
[Kneading Conditions]
First, the epoxy resin and the phenolic resin-based curing agent were charged, and mixed at 100° C. for 10 minutes to dissolve all solid ingredients. Next, after the temperature was adjusted to 70° C., the flux active agent represented by the general formula (1) or (2) and the curing agent were added and mixed for 5 minutes.
A semiconductor device was manufactured in accordance with the method for producing a semiconductor device described above by using each of the thermosetting resin compositions of Examples 1B to 5B and Comparative Example 1B obtained in the manner described above. Specifically, as shown in FIG. 4, a thermosetting resin composition 7 was heated to 70° C. and potted in a molten state on a printed circuit board 1 (glass epoxy board, thickness: 1 mm). The molten resin composition was placed on a stage heated to 100° C., and as shown in FIG. 5, a semiconductor element 3 (thickness: 600 μm, size: 13 mm×9 mm) was then provided with connecting electrodes 2 (eutectic solder, melting point: 183° C., electrode height: 120 μm) on given positions of the thermosetting resin composition 7. Thereafter, chip mounting was carried out using a flip chip bonder, thereby filling an air gap between the printed circuit board 1 and the semiconductor element 3 with a molten resin. Subsequently, the filled resin was subjected to solder reflow (Jedec condition) and resin curing (conditions of 150° C. for 30 minutes), thereby manufacturing a semiconductor device of which air gap was sealed with a sealing resin layer 4 as shown in FIG. 1 (8 semiconductor devices were prepared for each Examples and Comparative Example). Each of the resulting semiconductor devices was subjected to initial electric conductivity test. Further, this semiconductor device was allowed to absorb moisture under the environmental conditions of 30° C., 60% RH for 168 hours, and then to solder reflow (Jedec condition), and thereafter subjected to electric conductivity test. The results are shown in Table 2. Furthermore, each of the semiconductor devices was subjected to 1000 or 2000 cycles of thermal shock test (TST: one cycle comprising keeping at −50° C. for 5 minutes, and then keeping at 125° C. for 5 minutes), and thereafter subjected to an electric conductivity test (8 semiconductor devices for each Example or Comparative Example). The results are shown in Table 2.

TABLE 2

| Composition (carts by weight) | Examples | | | | | Comp. Examples |
|---|---|---|---|---|---|---|
| | 1B | 2B | 3B | 4B | 5B | 1B |
| Epoxy Resin (a1) | 7.0 | 7.0 | 7.0 | 7.0 | 7.0 | 7.0 |
| Epoxy Resin (a2) | 3.0 | 3.0 | 3.0 | 3.0 | 3.0 | 3.0 |
| Phenol Resin-Based Curing Agent | 5.77 | 5.77 | 5.77 | 5.77 | 5.77 | 5.77 |
| Flux Active Agent (b1) | 0.49 | 0.24 | 0 | 0 | 1.38 | 0 |
| Flux Active Agent (b2) | 0 | 0 | 0.49 | 0 | 0 | 0 |
| Flux Active Agent (b3) | 0 | 0 | 0 | 0.49 | 0 | 0 |
| Curing Accelerator | 0.12 | 0.12 | 0.12 | 0.12 | 0.12 | 0.12 |
| Inorganic Filler | 0 | 0 | 0 | 0 | 4.32 | 0 |
| Test Results | | | | | | |
| Melt Viscosity (Pa.s) at 70° C. | 0.37 | 0.36 | 0.59 | 0.65 | 1.1 | 0.48 |
| Initial Electric Conductivity Test (No. of Defective/Total No.) | 0/8 | 0/8 | 0/8 | 0/8 | 0/8 | 8/8 |
| Electric Conductivity Test after Moisture Absorption and Soldering (No. of Defective/Total No.) | 0/8 | 0/8 | 0/8 | 0/8 | 0/8 | — |
| Electric Conductivity Test after 1000 Cycles of TST (No. of Defective/Total No.) | 0/8 | 0/8 | 0/8 | 0/8 | 0/8 | — |
| Electric Conductivity Test after 2000 Cycles of TST (No. of Defective/Total No.) | 0/8 | 0/8 | 0/8 | 0/8 | 0/8 | — |

It was confirmed from Table 2 that Examples 1B to 5B showed no generation of defectiveness in all of the tests of the initial electric conductivity test, the electric conductivity test after moisture absorption and soldering, the electric conductivity test after 1000 cycles of TST, and the electric conductivity test after 2000 cycles of TST. On the other hand, all of Comparative Example 1B showed generation of defectiveness in the initial electric conductivity test.

Example C

Prior to carrying out Examples and Comparative Example, the following epoxy resin, acid anhydride-based curing agent, flux active agent, curing accelerator and inorganic filler were prepared.
[Epoxy Resin]
Bisphenol A epoxy resin (epoxy equivalence: 185 g/eq.)
[Acid Anhydride-Based Curing Agent]
4-Methylhexahydrophthalic anhydride/hexahydrophthalic anhydride (weight ratio 7/3, acid equivalence: 164 g/eq.)
[Flux Active Agent]

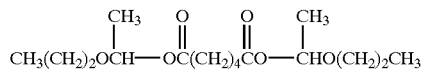

[Curing Accelerator]
2-Ethyl-4-methylimidazole
[Inorganic Filler]
Spherical silica (average particle size: 0.5 μm, maximal particle size: 1.0 μm)

The evaluation methods for the semiconductor devices in each of Examples and Comparative Example are collectively given hereinbelow.
(1) Initial Electric Conductivity Test and Electric Conductivity Test after Moisture Absorption and Soldering
The same procedures as in "Initial Electric Conductivity Test and Electric Conductivity Test after Moisture Absorption and Soldering" in Example A were carried out, except for using 20 semiconductor devices.
(2) Electric Conductivity by Thermal Shock Test (TST)
The same procedures as in "Electric Conductivity by TST" in Example A were carried out, except for using 20 semiconductor devices.

Examples 1C to 3C and Comparative Example 1C

Each of components shown in Table 3 was formulated in a ratio shown in the table, and mixed in a universal stirring vessel. Next, the mixture was filtered with a 300 mesh filter at room temperature, and thereafter the filtrate was defoamed under reduced pressure for 30 minutes, to give a desired liquid thermosetting resin composition.

A semiconductor device was manufactured in accordance with the method for producing a semiconductor device described above by using each of the thermosetting resin compositions of Examples 1C to 3C and Comparative Example 1C obtained in the manner described above. Specifically, as shown in FIG. 4, the above-mentioned liquid thermosetting resin composition 7 was potted on a printed circuit board 1 (glass epoxy board, thickness: 1 mm). The liquid resin composition was placed on a stage, and as shown in FIG. 5, a semiconductor element 3 (thickness: 600 μm, size: 13 mm×9 mm) was then provided with connecting electrodes 2 (eutectic solder, melting point: 183° C., electrode height: 120 μm) on given positions of the above-mentioned liquid thermosetting resin composition 7. Thereafter, chip mounting was carried out using a flip chip bonder, thereby filling an air gap between the printed circuit board 1 and the semiconductor element 3 with a molten resin. Subsequently, the filled resin was subjected to solder reflow (Jedec condition) and resin curing (conditions of 75° C. for 30 hours), thereby manufacturing a semiconductor device of which air gap was sealed with a sealing resin layer 4 as shown in FIG. 1 (20 semiconductor devices were prepared for each Examples and Comparative Example). Each of the resulting semiconductor devices was subjected to initial electric conductivity test. Further, this semiconductor device was allowed to absorb moisture under the environmental conditions of 30° C., 60% RH for 168 hours, and then to solder reflow (Jedec condition), and thereafter subjected to electric conductivity test. The results are shown in Table 3. Furthermore, each of the semiconductor devices (20 semiconductor devices for each Example or Comparative Example) was subjected to 1000 or 2000 cycles of thermal shock test (TST: one cycle comprising keeping at −50° C. for 5 minutes, and then keeping at 125° C. for 5 minutes), and thereafter subjected to an electric conductivity test (20 semiconductor devices for each Example or Comparative Example). The results are shown in Table 3.

TABLE 3

| Composition (parts by weight) | Examples | | | Comp. Examples |
|---|---|---|---|---|
| | 1C | 2C | 3C | 1C |
| Epoxy Resin | 100 | 100 | 100 | 100 |
| Acid Anhydride-Based Curing Agent | 88.6 | 88.6 | 88.6 | 88.6 |
| Flux Active Agent | 5.8 | 9.92 | 8.33 | 0 |
| Curing Accelerator | 0.01 | 0.01 | 0.01 | 0.01 |
| Inorganic Filler | 0 | 0 | 80.8 | 0 |
| Test Results | | | | |
| Melt Viscosity (Pa · s) at 25° C. | 5.5. | 5.6 | 16.6 | 5.4 |
| Initial Electric Conductivity Test (No. of Defective/Total No.) | 0/20 | 0/20 | 0/20 | 11/20 |
| Electric Conductivity Test after Moisture Absorption and Soldering (No. of Defective/Total No.) | 0/20 | 0/20 | 0/20 | 13/20 |
| Electric Conductivity Test after 1000 Cycles of TST (No. of Defective/Total No.) | 0/20 | 0/20 | 0/20 | 13/20 |
| Electric Conductivity Test after 2000 Cycles of TST (No. of Defective/Total No.) | 0/20 | 0/20 | 0/20 | 14/20 |

It was confirmed from Table 3 that Examples 1C to 3C showed no generation of defectiveness in all of the tests of the initial electric conductivity test, the electric conductivity test after moisture absorption and soldering, the electric conductivity test after 1000 cycles of TST, and the electric conductivity test after 2000 cycles of TST. On the other hand, Comparative Example 1C showed generation of defectiveness in more than one-half of the number of the semiconductor devices in each test.

Example D

Prior to carrying out Examples and Comparative Examples, the following epoxy resin, curing agent, flux active agent, microcapsulated curing accelerators and curing accelerator were prepared.
[Epoxy Resin]
Bisphenol A epoxy resin (epoxy equivalence: 185 g/eq.)
[Curing Agent]
Cresol novolak resin (hydroxyl equivalence: 104 g/eq.)
[Flux Active Agent]
Adipic acid-cyclohexyl divinyl ether polymer (acid equivalence: 269 g/mol, molecular weight (Mn): 1100)
[Microcapsulated Curing Accelerators (a) to (d)]
Each of the microcapsulated curing accelerators (a) to (d) of the following Table 4 was prepared in accordance with the method described above. First, each component shown below was prepared, and formulated in a ratio shown in Table 4.
<Isocyanate Monomer>
(X) An ethyl acetate solution of an adduct of 3 mol of tolylene diisocyanate with 1 mol of trimethylolpropane (75% by weight solution)
(Y) An ethyl acetate solution of an adduct of 3 mol of xylene diisocyanate with 3 mol of trimethylolpropane (75% by weight solution)
(Z) Polyphenylene polyisocyanate
<Polyamine>
Diethylenetriamine
<Dispersion Stabilizer>
Polyvinyl alcohol (PVA)
<Curing Accelerator>
Triphenylphosphine (TPP)

An ethyl acetate solution of a prescribed isocyanate monomer and triphenylphosphine (TPP) were homogeneously dissolved in toluene to prepare an oil phase. Next, a water phase comprising distilled water and polyvinyl alcohol (PVA) was separately prepared, and the oil phase prepared above was added to the water phase. The mixture was emulsified into an emulsion state with a homomixer. The resulting mixture was charged in a polymerization reactor equipped with a reflux tube, a stirrer, and a dropping funnel. On the other hand, an aqueous solution containing diethylenetriamine (DTA) was prepared, and the aqueous solution was charged in the dropping funnel provided to the polymerization reactor. The aqueous solution was added dropwise to the emulsion in the reactor to carry out interfacial polymerization at 70° C. for 3 hours, to give an aqueous suspension of a microcapsulated curing accelerator. Subsequently, polyvinyl alcohol and the like in the aqueous phase were removed by centrifugation, and thereafter distilled water was added to re-disperse the mixture, to give a suspension. The pH of this suspension was adjusted to 3 by adding dropwise formic acid to the suspension system. By the above procedures, there was prepared a microcapsulated curing accelerator of which amino groups on the shell surface and the internal thereof were blocked with formic acid. The microcapsulated curing accelerator was subjected to repetitive treatments of separation by centrifugation and washing with water, the microcapsulated curing accelerator was then dried to be isolated as a powdery particle having free flowability. The average particle size, the shell thickness and the core content of the resulting microcapsulated curing accelerator are shown in Table 4.

TABLE 4

| Composition (Parts by weight) | (a) | (b) | (c) | (d) | (e) |
|---|---|---|---|---|---|
| Isocyanate Monomer (X) | 57.7 | 153.4 | | | |
| Isocyanate Monomer (Y) | 134.1 | 38.4 | 38.4 | | 143.9 |
| Isocyanate Monomer (Z) | | | 115.1 | 143.9 | |
| Polyamine | 28.8 | 28.8 | 28.8 | 28.8 | 28.8 |
| Dispersion Stabilizer | 24 | 24 | 24 | | |
| Curing Accelerator | 61.7 | 61.7 | 61.7 | 61.7 | 61.7 |
| Toluene | 16 | 16 | 16 | 16 | 16 |
| Distilled Water | 516 | 516 | 516 | 516 | 516 |
| Average Particle Size (μm) of | 3 | 3 | 3 | 3 | 3 |

TABLE 4-continued

| Composition (Parts by weight) | (a) | (b) | (c) | (d) | (e) |
|---|---|---|---|---|---|
| Microcapsulated Curing Accelerator Shell Thickness (μm) of Microcapsulated Curing Accelerator | 0.4 | 0.4 | 0.4 | 0.4 | 0.4 |
| Core Content (% by weight) of Microcapsulated Curing Accelerator | 30 | 30 | 30 | 30 | 30 |

[Curing Accelerator]
Triphenylphosphine

Examples 1D to 4D and Comparative Examples 1D and 2D

Each of components shown in Table 5 was formulated in a ratio shown in the table, and mixed in a universal stirring vessel at 80° C. Next, the mixture was filtered with a 400 mesh filter, and thereafter the filtrate was defoamed under reduced pressure for 30 minutes, to give a desired thermosetting resin composition for sealing semiconductor. The reaction exothermic peak temperature of each of the resulting thermosetting resin compositions was determined by using differential scanning calorimeter (commercially available from Perkin-Elmer under the trade name of PyTis), at a heating rate of 10° C. as described above.

Figure 6:
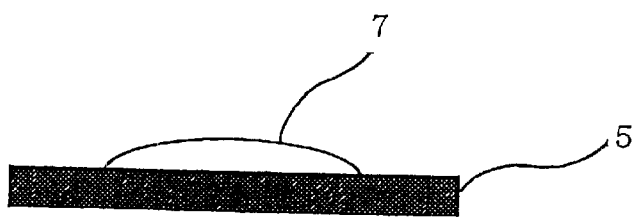
FIG. 6 is a schematic cross-sectional view showing a process for wettability test of solder.
Figure 7:
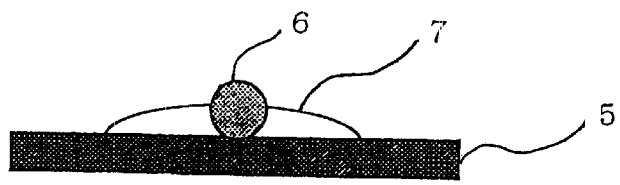
FIG. 7 is a schematic cross-sectional view showing a process for wettability test of solder.
Figure 8:
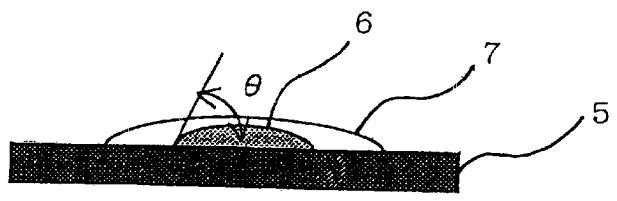
FIG. 8 is a schematic cross-sectional view showing a process for wettability test of solder.

Using the thermosetting resin composition of each of Examples 1D to 4D and Comparative Examples 1D and 2D obtained above, the wettability test of solder was conducted. The test was carried out as follows. As shown in FIG. 6, a thermosetting resin composition 7 was applied to pre-flux-coated copper plate 5 surface-treated with pre-flux (commercially available from Tamura Kaken, WLF16), and the resulting copper plate was mounted on a hot plate at 80° C. As shown in FIG. 7, ten solder balls 6 [commercially available from Senju Kinzoku, 63 Sn-37 Pb solder (melting point: 183° C.), or Sn—Ag solder (melting point: 220° C.), ball diameter: 500 μm] were added to a thermosetting resin composition 7. Each of the ball-added resin compositions was allowed to stand on a hot plate for one minutes, wherein the hot plate was adjusted to 200° C. for 63 Sn-37 Pb solder, and the hot plate was adjusted to 240° C. for Sn—Ag solder, to carry out solder fusion and connection. The number of connections of the solder balls 6 of the test sample as shown in FIG. 8 thus obtained, and a contact angle θ between the connected solder balls 6 and the pre-flux-coated copper plate 5 were determined, to evaluate the wettability of the solder.

TABLE 5

| | Examples | | | | Comp. Examples | |
|---|---|---|---|---|---|---|
| Composition (Parts by weight) | 1D | 2D | 3D | 4D | 1D | 2D |
| Epoxy Resin | 150.8 | 150.8 | 150.8 | 150.8 | 150.8 | 150.8 |
| Phenolic Resin | 80 | 80 | 80 | 80 | 80 | 80 |
| Microcapsulated Curing Accelerator (a) | 3.2 | | | | | |
| Microcapsulated Curing Accelerator (b) | | 3.2 | | | | |
| Microcapsulated Curing Accelerator (c) | | | 3.2 | | | |
| Microcapsulated Curing Accelerator (d) | | | | 3.2 | | |
| Microcapsulated Curing | | | | | 3.2 | |

TABLE 5-continued

| | Examples | | | | Comp. Examples | |
|---|---|---|---|---|---|---|
| Composition (Parts by weight) | 1D | 2D | 3D | 4D | 1D | 2D |
| Accelerator (e) | | | | | | |
| Curing Accelerator (TPP) | | | | | 0.96 | |
| Flux Active Agent | 12.4 | 12.4 | 12.4 | 12.4 | 12.4 | 12.4 |
| Test Results | | | | | | |
| DSC Peak Temp. (° C.) | 186 | 193 | 228 | 247 | 160 | 175 |
| No. of Connections (63 Sn-37 Pb) (No. of Connections, Total No.) | 10/10 | 10/10 | 10/10 | 10/10 | 2/10 | 7/10 |
| Average Contact Angle (°) of Connected Solder (63 Sn-37 Pb) | 17 | 12 | 11 | 11 | 23 | 21 |
| No. of Connections (Ag-Sn) (No. of Connections, Total No.) | 3/10 | 4/10 | 10/10 | 10/10 | 0/10 | 0/10 |
| Average Contact Angle (°) of Connected Solder (Ag-Sn) | 48 | 47 | 38 | 36 | — | — |

It was shown from Table 5 that Examples 1D to 4D showed more excellent wettability of solder balls to copper plate and higher connection ratio as compared to those of Comparative Examples 1D and 2D in the solder connection test. Further, Examples 1D to 4D had a reaction exothermic peak as determined by differential scanning calorimeter on a high-temperature side, as compared to those of Comparative Examples 1D and 2D. Therefore, it was confirmed that the reaction exothermic peak of the thermosetting resin composition in the differential scanning calorimetric determination can be controlled by properly selecting the composition of the shell portion of the microcapsulated curing accelerator. In addition, in the solder connection test, its connection ratio was more excellent for the thermosetting resin composition of which reaction exothermic peak exists on a higher temperature region than the melting point of the solder.

Equivalent

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A sheet-like thermosetting resin composition usable for sealing a gap formed between a printed circuit board and a semiconductor element in a semiconductor package having a face-down structure, comprising a compound having the general formula (1):

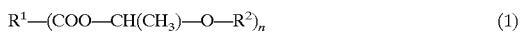

$$R^1\text{—(COO—CH(CH}_3\text{)—O—R}^2)_n \quad (1)$$

wherein n is a positive integer; $R^1$ is a monovalent or higher polyvalent organic group; and $R^2$ is a monovalent organic group, wherein $R^1$ and $R^2$ may be identical or different, or a compound having the general formula (2):

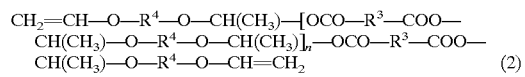

$$CH_2=CH\text{—O—}R^4\text{—O—CH(CH}_3\text{)—[OCO—}R^3\text{—COO—CH(CH}_3\text{)—O—}R^4\text{—O—CH(CH}_3\text{)]}_n\text{—OCO—}R^3\text{—COO—CH(CH}_3\text{)—O—}R^4\text{—O—CH=CH}_2 \quad (2)$$

wherein n is a positive integer; each of $R^3$ and $R^4$ is a divalent organic group, wherein $R^3$ and $R^4$ may be identical or different.

2. The sheet-like thermosetting resin composition according to claim 1, which comprises a phenolic resin as a curing agent.

3. A thermosetting resin composition usable for sealing a gap formed between a printed circuit board and a semiconductor element in a semiconductor package having a face-down structure, comprising:

an epoxy resin, a phenolic resin-based curing agent and a compound having the general formula (1):

$$R^1-(COO-CH(CH_3)-O-R^2)_n \qquad (1)$$

wherein n is a positive integer; $R^1$ is a monovalent or higher polyvalent organic group; and $R^2$ is a monovalent organic group, wherein $R^1$ and $R^2$ may be identical or different, or a compound having the general formula (2):

$$CH_2=CH-O-R^4-O-CH(CH_3)-[OCO-R^3-COO-CH(CH_3)-O-R^4-O-CH(CH_3)]_n-OCO-R^3-COO-CH(CH_3)-O-R^4-O-CH=CH_2 \qquad (2)$$

wherein n is a positive integer; each of $R^3$ and $R^4$ is a divalent organic group, wherein $R^3$ and $R^4$ may be identical or different.

4. The thermosetting resin composition according to claim 3, wherein the thermosetting resin composition has a melt viscosity of 100 Pa·s or less at 70° C., and is solid at 25° C.

5. A process for manufacturing a semiconductor device comprising the steps of:

applying the thermosetting resin composition of claim 3 to a wafer, dicing the coated wafer into individual chips, and carrying out chip-mounting.

6. A process for manufacturing a semiconductor device comprising the steps of:

applying the thermosetting resin composition of claim 4 to a wafer, dicing the coated wafer into individual chips, and carrying out chip-mounting.

7. A thermosetting resin composition comprising:

an epoxy resin, an acid anhydride-based curing agent and a compound having the general formula (1):

$$R^1-(COO-CH(CH_3)-O-R^2)_n \qquad (1)$$

wherein n is a positive integer; $R^1$ is a monovalent or higher polyvalent organic group; and $R^2$ is a monovalent organic group, wherein $R^1$ and $R^2$ may be identical or different, or a compound having the general formula (2):

$$CH_2=CH-O-R^4-O-CH(CH_3)-[OCO-R^3-COO-CH(CH_3)-O-R^4-O-CH(CH_3)]_n-OCO-R^3-COO-CH(CH_3)-O-R^4-O-CH=CH_2 \qquad (2)$$

wherein n is a positive integer; each of $R^3$ and $R^4$ is a divalent organic group, wherein $R^3$ and $R^4$ may be identical or different, and wherein the thermosetting resin composition is liquid at 25° C.

8. A thermosetting resin composition comprising:

(A) an epoxy resin having at least two epoxy groups in its molecule, (B) a curing agent, (C) a compound having the general formula (1):

$$R^1-(COO-CH(CH_3)-O-R^2)_n \qquad (1)$$

wherein n is a positive integer; $R^1$ is a monovalent or higher polyvalent organic group; and $R^2$ is a monovalent organic group, wherein $R^1$ and $R^2$ may be identical or different, or a compound having the general formula (2):

$$CH_2=CH-O-R^4-O-CH(CH_3)-[OCO-R^3-COO-CH(CH_3)-O-R^4-O-CH(CH_3)]_n-OCO-R^3-COO-CH(CH_3)-O-R^4-O-CH=CH_2 \qquad (2)$$

wherein n is a positive integer; each of $R^3$ and $R^4$ is a divalent organic group, wherein $R^3$ and $R^4$ may be identical or different; and (D) a microcapsulated curing accelerator comprising a core portion comprising a curing accelerator, and a shell portion formed so as to cover the core portion, the shell portion comprising a polymer having a structural unit represented by a general formula (3):

$$-N(R^5)-CO-N(R^6)- \qquad (3)$$

wherein each of $R^5$ and $R^6$ is hydrogen atom or a monovalent organic group, wherein $R^5$ and $R^6$ may be identical or different, wherein the thermosetting resin composition has a reaction exothermic peak of 180° to 250° C. with a programming rate of 10° C./min in the differential scanning calorimetric determination.

9. A semiconductor device comprising:

a printed circuit board, a semiconductor element, and the thermosetting resin composition of any one of claims 1 to 4, 7 and 8, wherein a gap formed between the printed circuit board and the semiconductor element is sealed by the thermosetting resin composition.

* * * * *